(12) United States Patent
Boileau et al.

(10) Patent No.: US 12,503,391 B2
(45) Date of Patent: Dec. 23, 2025

(54) BUFFER LAYER FOR THE CRYSTAL GROWTH OF METAL OXIDES OF PEROVSKITE TYPE IN PARTICULAR ON AMORPHOUS SUBSTRATES

(71) Applicants: CENTRE NATIONAL DE LA RECHERCHE SCIENTIFIQUE, Paris (FR); ECOLE NATIONALE SUPERIEURE D'INGENIEURS DE CAEN, Caen (FR); UNIVERSITE DE CAEN NORMANDIE, Caen (FR)

(72) Inventors: Alexis Boileau, Remiremont (FR); Christophe Cibert, Hérouville Saint-Clair (FR); Adrian David, Ranville (FR); Arnaud Fouchet, Douvres-la-Délivrande (FR); Fabrice Gourbilleau, Courseulles-sur-Mer (FR); Christophe Labbé, Authie (FR); Ulrike Lüders, Hermanville-sur-Mer (FR); Gilles Poullain, Banville (FR)

(73) Assignees: CENTRE NATIONAL DE LA RECHERCHE SCIENTIFIQUE, Paris (FR); ECOLE NATIONALE SUPERIEURE D'INGENIEURS DE CAEN, Caen (FR); UNIVERSITE DE CAEN NORMANDIE, Caen (FR)

(*) Notice: Subject to any disclaimer, the term of this patent is extended or adjusted under 35 U.S.C. 154(b) by 193 days.

(21) Appl. No.: 18/018,346

(22) PCT Filed: Jul. 22, 2021

(86) PCT No.: PCT/FR2021/051371
§ 371 (c)(1),
(2) Date: Jan. 27, 2023

(87) PCT Pub. No.: WO2022/023651
PCT Pub. Date: Feb. 3, 2022

(65) Prior Publication Data
US 2023/0298778 A1 Sep. 21, 2023

(30) Foreign Application Priority Data
Jul. 28, 2020 (FR) .................................... 2007968

(51) Int. Cl.
*C03C 17/34* (2006.01)
*C23C 14/08* (2006.01)
(Continued)

(52) U.S. Cl.
CPC ........ *C03C 17/3417* (2013.01); *C23C 14/083* (2013.01); *C23C 14/088* (2013.01);
(Continued)

(58) Field of Classification Search
CPC .... H01B 1/08; C03C 17/3417; C03C 2217/94
(Continued)

(56) References Cited

U.S. PATENT DOCUMENTS

2010/0102450 A1    4/2010   Narayan

FOREIGN PATENT DOCUMENTS

CN         101826550 A       9/2010

OTHER PUBLICATIONS

Alshoaibi, "Electrical Properties of Rare Earth Doped Barium Titanate", May 2017, University of Sheffield, pp. 1-306, URL: <https://etheses.whiterose.ac.uk/id/eprint/17289/7/Thesis%20-%20Adil%20Alshoaibi%20-%20Corrected.pdf> (Year: 2017).*
(Continued)

*Primary Examiner* — Katherine A Christy
(74) *Attorney, Agent, or Firm* — CANTOR COLBURN LLP

(57) ABSTRACT

A multilayer conductive system of metal oxides, the system including a substrate; a layer of a crystalline binary metal
(Continued)

oxide deposited on the substrate, and a layer of a crystalline conductive metal oxide having a crystalline structure of perovskite type superposed over the layer of binary metal oxide, where the binary metal oxide of the layer has a local lattice mismatch of less than 5% with respect to that of the metal oxide of the layer, provided that when the metal oxide of perovskite type of the layer is a crystalline transparent conductive metal oxide, the substrate is transparent, and the thickness of the crystalline binary metal oxide layer is <20 nm, preferably <10 nm, most preferentially 5-7 nm.

18 Claims, 13 Drawing Sheets

(51) Int. Cl.
  *C23C 14/28* (2006.01)
  *C23C 14/34* (2006.01)
  *H01B 1/08* (2006.01)
  *H10K 10/82* (2023.01)

(52) U.S. Cl.
  CPC .............. *C23C 14/28* (2013.01); *C23C 14/34* (2013.01); *H01B 1/08* (2013.01); *H10K 10/82* (2023.02); *C03C 2217/94* (2013.01); *C03C 2218/151* (2013.01); *C03C 2218/154* (2013.01)

(58) Field of Classification Search
  USPC ........................................................ 428/698
  See application file for complete search history.

(56) References Cited

OTHER PUBLICATIONS

International Search Report for corresponding application PCT/FR2021/051371 filed Jul. 22, 2021; Mail date Oct. 25, 2021.
Judit G. Lisoni, "The Growth of MgO buffer layers on Sapphire for the epitaxy of BaTiO3 Opitical thin films", Thin Solid Films 389, (2001) 219-226.
L. Beckers, "Structural and Optical Characterization of Epitaxial Waveguiding BaTiO3 Thin Films on MgO", Journal of Applied Physics, vol. 83, No. 6 Mar. 15, 1998.
M. Schubert, "Electro-optical properties of ZnO-BaTiO3-ZnO heterstructures frown by pulsed laser deposition", Ann. Phys (Leipzig) 13, No. 1-2, 61-62 (2004).
Muhammad Arif Riza, "Prospects and Challenges of Perovskite Type Transparent Conductive Oxides in Photovoltaic Applications, Part II Synthesis and Deposition", Solar Energy, 139 (2016) pp. 309-317.
Ruixing Xu, "Perovskite Transparent Conducting Oxide for the Design of a Transparent, Flexible, and Self-Powered Perovskite Photodetector", ACS., Appl. Mater Interfaces 2020, 12, 16462-16468.
Shiu-Jen Liu, "Growth and Transport Properties of (110)-Oriented La2/3Sr1/3Mn03 Thin Films on TiO2-Buffered Si (100) Substrates", Jpn J Appl. Phys. vol. 42 (2003) pp. 287-290.
Texture Contro; of PbTiO3 and Pb(Zr, Ti)O3 thin films with TiO2 Seeding, Journal of Applied Physics, vol. 83, No. 7, Apr. 1, 2018.
W.B Luo, "Improved csystalline properties of laser molecular bem epitaxy grown SrTio3 by rutile TiO2 layer on hexagonal GaN", Journal of Applied Physics 106, 104120 (2009).

* cited by examiner

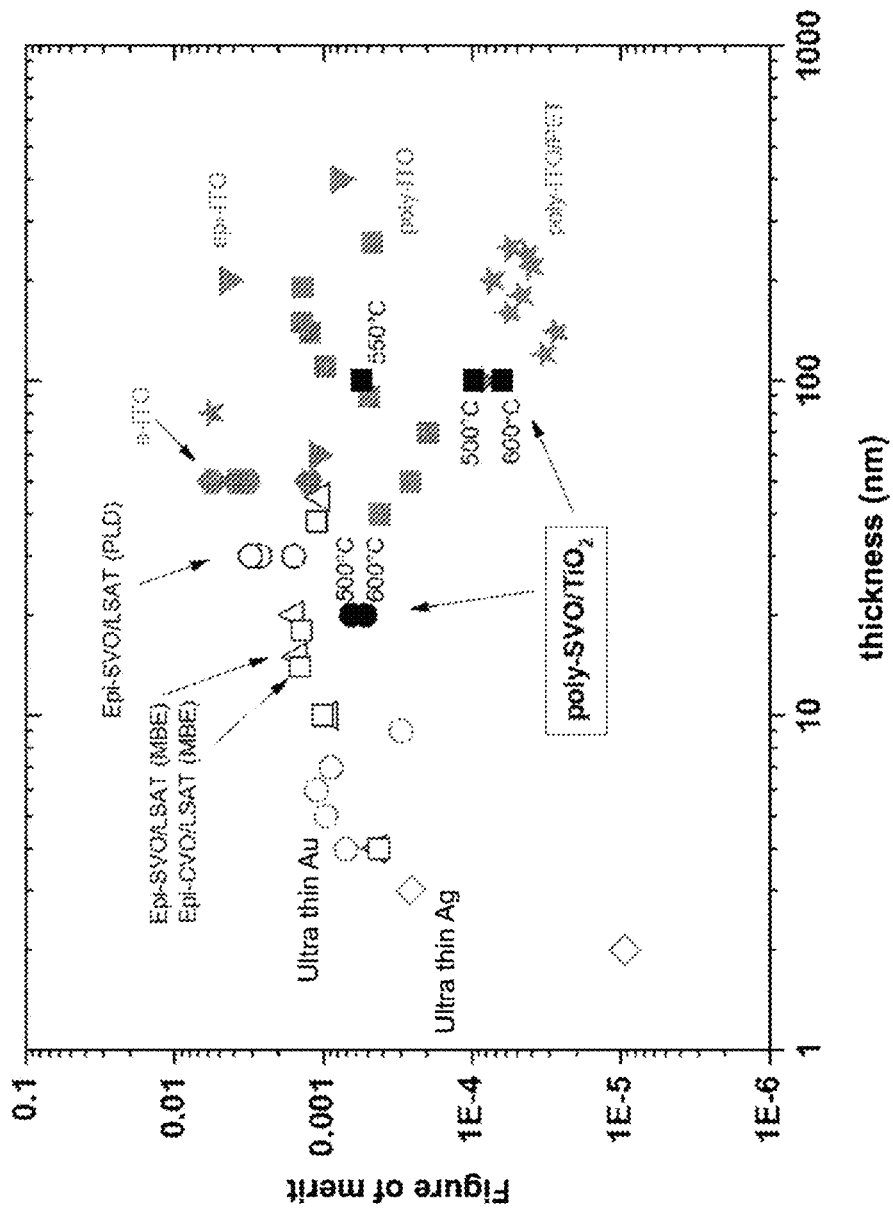
[FIG. 5]

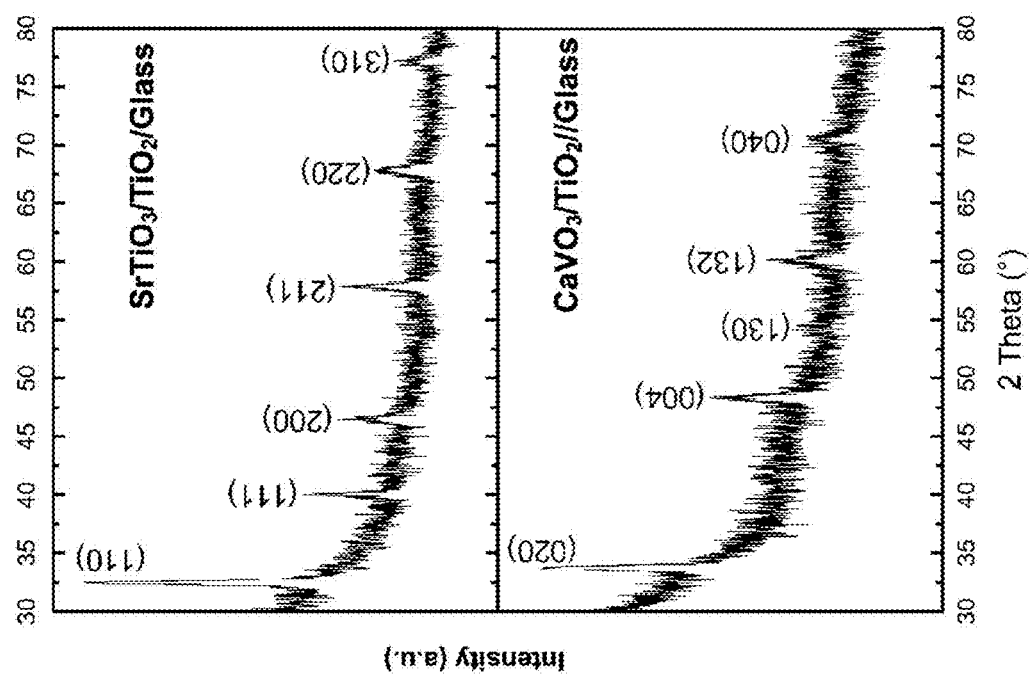
[FIG. 6]

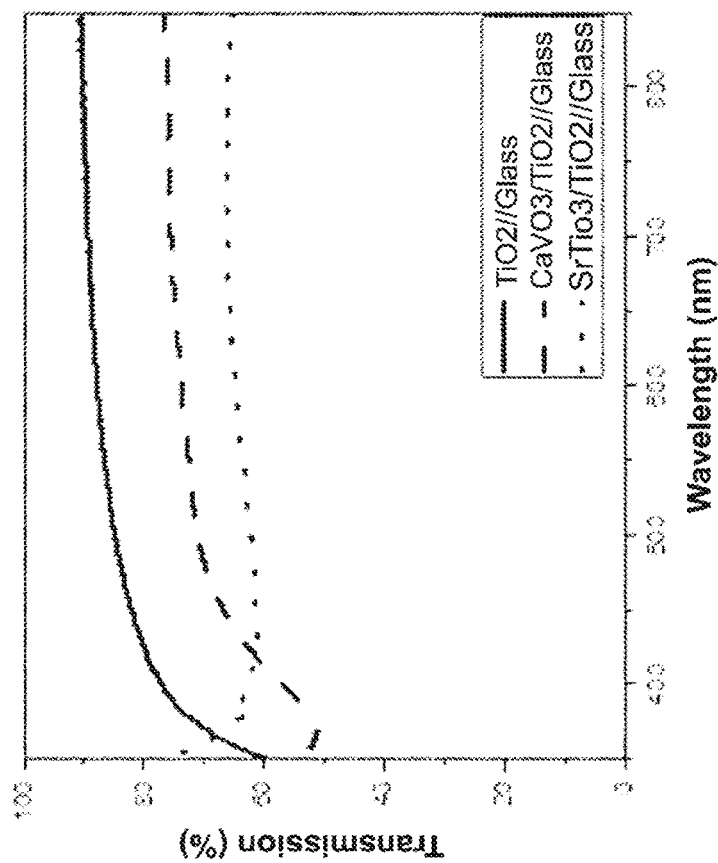
[FIG. 7]

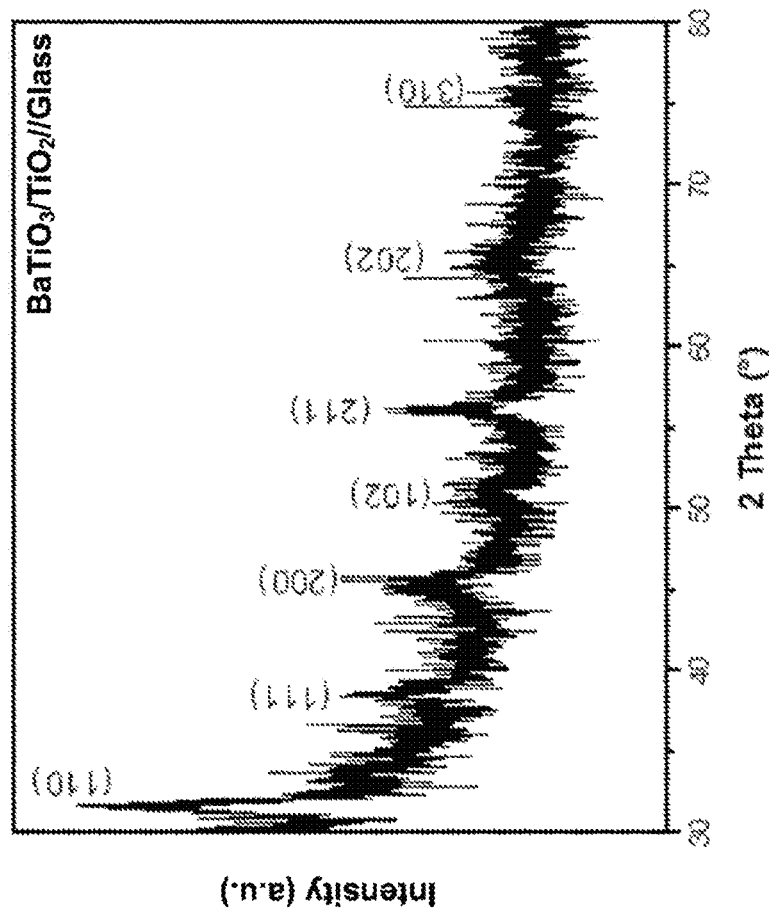
[FIG. 8]

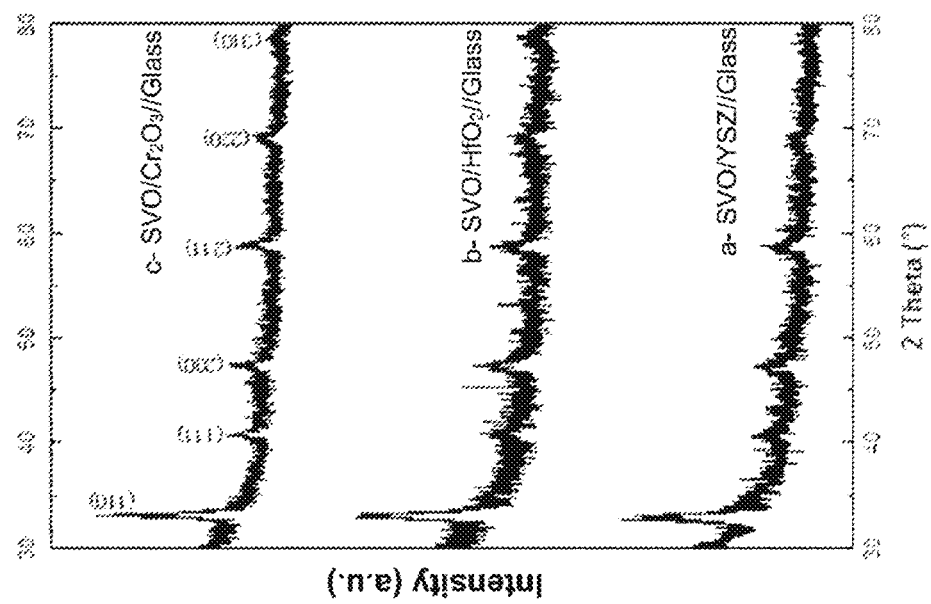
[FIG. 9]

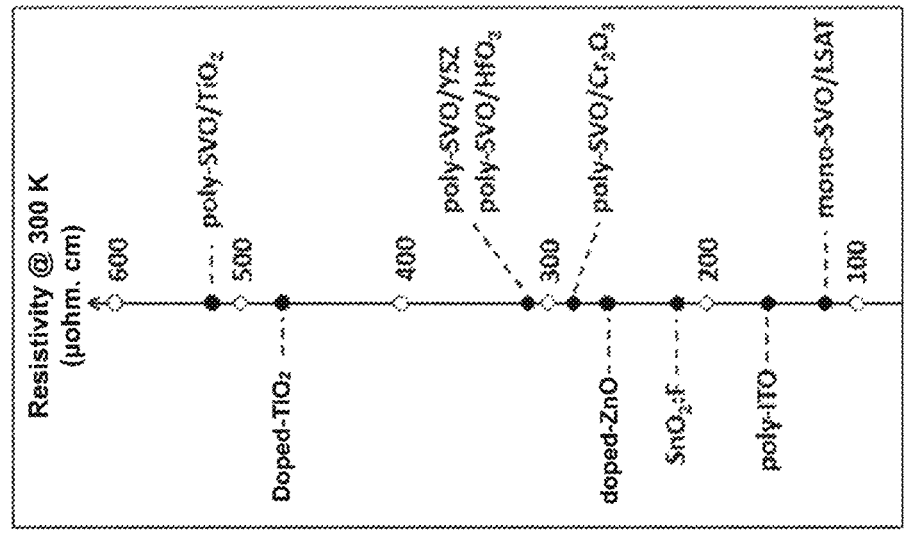
[FIG. 10]

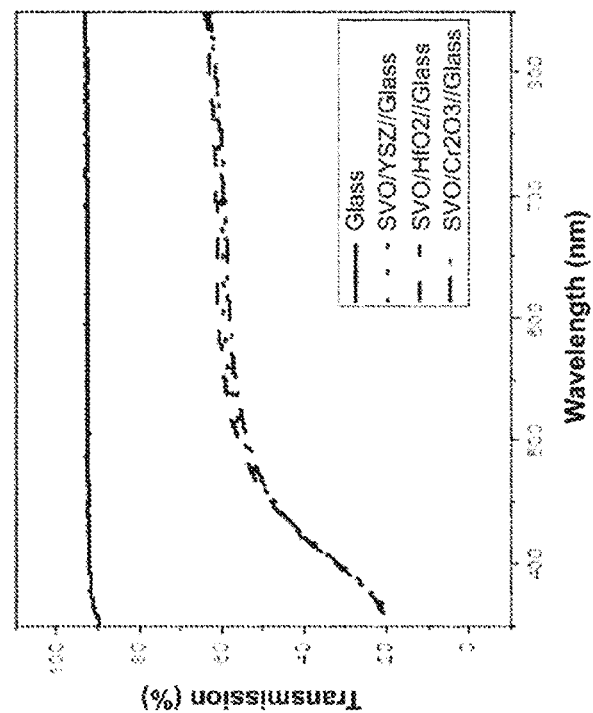
[FIG. 11]

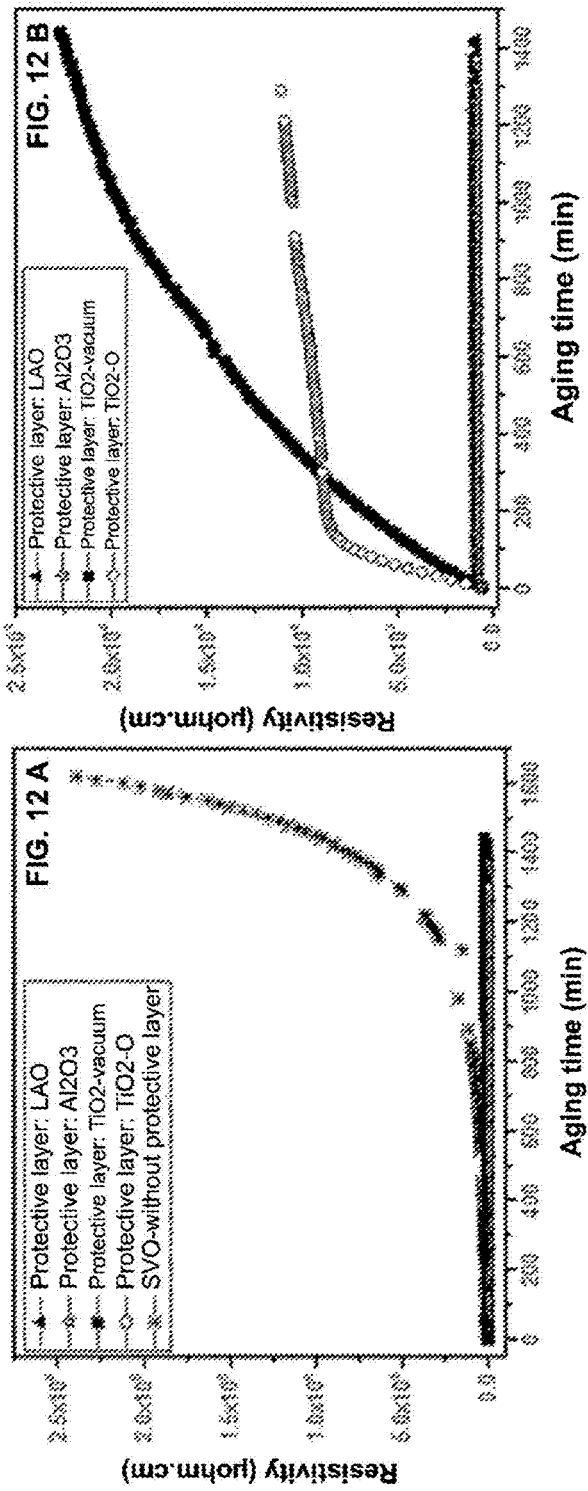

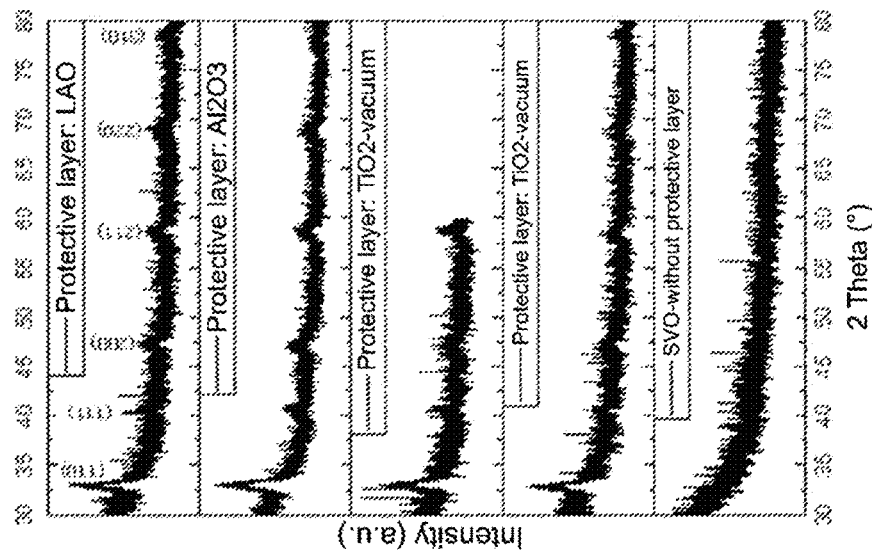
[FIG. 13]

BUFFER LAYER FOR THE CRYSTAL GROWTH OF METAL OXIDES OF PEROVSKITE TYPE IN PARTICULAR ON AMORPHOUS SUBSTRATES

TECHNICAL FIELD OF THE INVENTION

The present invention relates to metal oxides having a crystalline structure of perovskite type, and a method enabling their crystal growth on a substrate that may even be unsuitable, such as an amorphous substrate.

STATE OF THE ART

Transparent conductive oxides (TCOs) are an important class of materials with a wide range of technological applications such as flat and touch screens, light-emitting diodes, solar cells, electrochromic cells or even transparent antennas. The standard material commonly used is tin-doped indium oxide ($In_2O_3$—$SnO_2$, ITO), which has excellent functional properties with transparency in the visible spectrum of the order of 80% and electrical resistivity typically below 100 µΩcm. In addition, the amorphous form of the ITO is conductive, which enables it to be easily integrated into complex devices without being limited by structural compatibility and the need to deposit it at high temperatures. Consequently, ITO is the main TCO used in industrial devices due to its excellent properties and the flexibility of its integration.

However, the use of indium is the main drawback of ITOs. This element, far from being an abundant resource, is subject to significant price variations and may be difficult to procure in devices that increasingly make use of TCO. Consequently, the search for new indium-free TCOs has been a very active field for a number of decades now. One of the key candidates is doped ZnO but, despite the efforts made, its properties fall short of those of ITO. In particular, the resistivity of the doped ZnO is one of the main limitations that prevents ITO being substituted in current applications.

In 2016, new TCOs based on strongly correlated vanadate perovskites were identified (Ref. 1). More specifically, these materials which include $SrVO_3$ (SVO) and $CaVO_3$ (CVO), are metal systems having strong electronic correlations, which lead to an increase in the effective mass and consequently, to the shift of the plasma frequency in the near infrared outside the visible range. With a carrier density of the order of $10^{22}$ cm$^{-3}$, much higher than that of ITO (up to $10^{21}$ cm$^{-3}$), SVO and CVO have very low resistivity although the mobility of the charge carriers is several orders of magnitude lower than that of semiconductor TCOs. Both the resistivity and the optical transparency of the epitaxial thin films proved comparable to those of ITO, thus positioning these emerging indium-free TCOs as a serious alternative to ITO.

However, the technological potential of vanadate TCOs seems to be limited by their crystalline structure. Indeed, it has been shown that SVO must imperatively be crystallized in order to have a conductive behavior (Ref. 4). In addition, the perovskite structure is not the most stable of the Sr—V—O system and only has the desired functional properties if it is stabilized on a suitable substrate (Refs. 6, 19). Direct growth on silicon was reported but remains very difficult to reproduce (Refs. 20, 21). Growth on glass, which is one of the most suitable substrates for TCOs, has never been reported in the literature. In fact, our experience shows that it is impossible to induce the perovskite structure of SVO due to the amorphous nature of the glass. Consequently, the use of vanadate TCOs in actual devices (using transparent substrates) is greatly compromised, relegating these new TCOs outside the scope of possible applications despite their remarkable properties.

There is therefore a real need to develop a means enabling vanadate TCOs to crystallize on unsuitable substrates such as glass, preserving both the resistivity properties of vanadate TCOs and the optical transparency of the assembly. This need extends more broadly to crystalline metal oxides of perovskite type.

BRIEF DESCRIPTION OF THE FIGURES

FIG. 5 shows: Figure of merit $\Phi_{TC}$ of thin films of $SrVO_3/TiO_2$/glass having a thickness of 100 and 20 nm (solid black squares and circles), and compared with single-crystal epitaxial $SrVO_3$ films on LSAT by PLD (open black circles) (Ref. 4), of epitaxial $SrVO_3$ and $CaVO_3$ on LSAT by MBE (open black triangles and squares) (Ref. 1), of single-crystal ITO (solid gray triangles) (Refs. 22, 23), of polycrystalline ITO on glass (solid gray squares) (Ref. 24) and on PET (gray stars) (Ref. 25), of amorphous ITO (gray hexagons) (Ref. 26) and of ultra-thin metal layers of gold (open gray circles) and silver (open gray diamonds) (Refs. 27, 28).

FIG. 6 shows the X-ray diagrams in grazing incidence configuration of the films of $CaVO_3$ and $SrTiO_3$ deposited on a $TiO_2$ buffer layer.

FIG. 7 shows the optical transmission spectra of the films of $CaVO_3/TiO_2$/glass, $SrTiO_3/TiO_2$/glass and a substrate coated with a layer of $TiO_2$ used as reference.

FIG. 8 shows the X-ray diffraction diagram of thin films of $BaTiQ_3$.

FIG. 9 shows the X-ray diffraction diagrams in grazing incidence configuration of the $SrVO_3$ films deposited on the different buffer layers: YSZ, $HfO_2$ and $Cr_2O_3$.

FIG. 10 shows a comparison of the resistivity measurements at 300 K of the SVO films deposited on the different buffer layers ($TiO_2$, YSZ, $HfO_2$ and $Cr_2O_3$) with the data from the literature on transparent conductive oxides used as TCO.

FIG. 11 shows the optical transmission spectra of the SVO films deposited on the three buffer layers of $SrVO_3$/YSZ/

Figure 1:
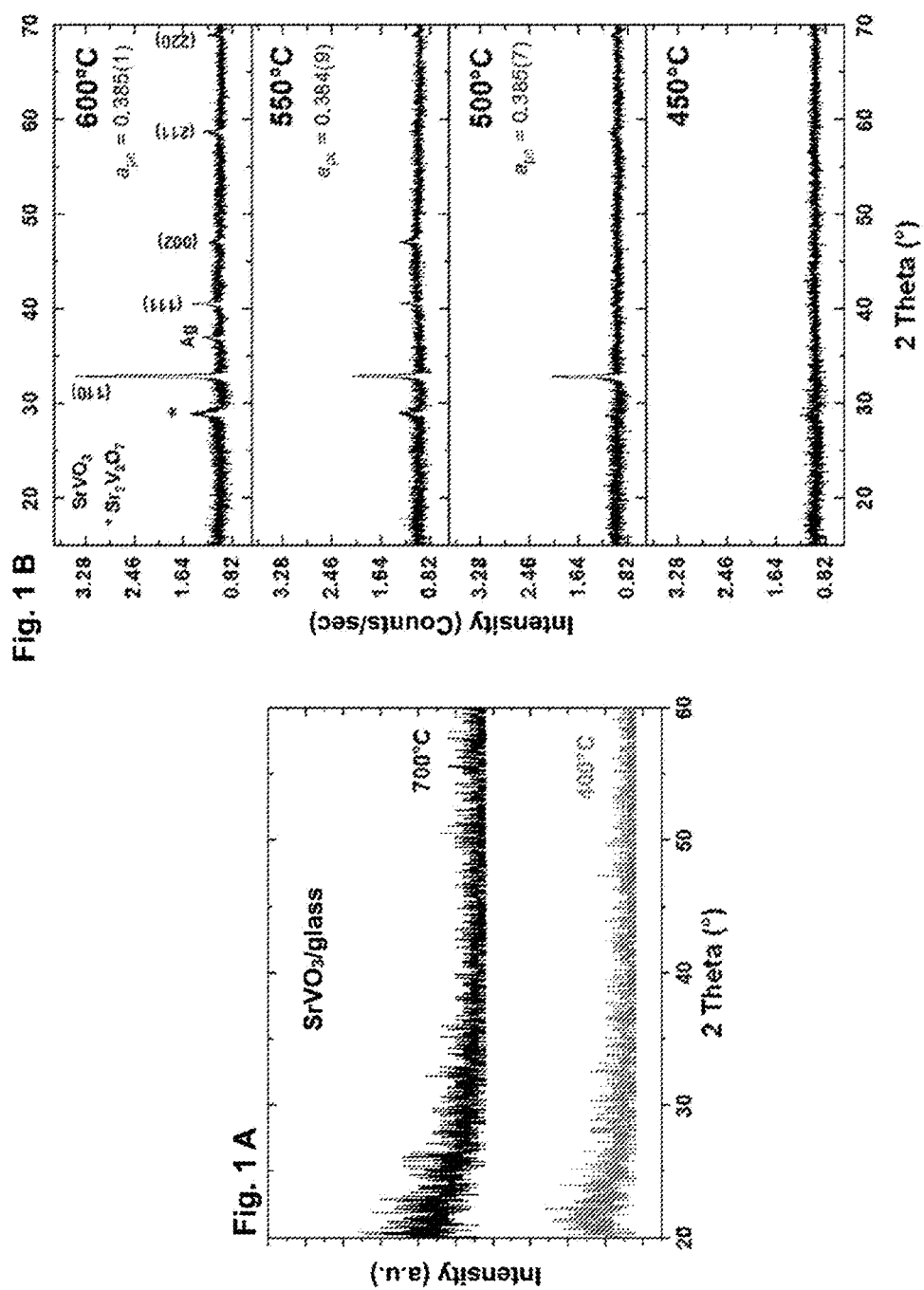
FIG. 1 shows: (a) Diffractograms obtained by X-ray diffraction of thin amorphous films of $SrVO_3$ having a thickness of 80 nm, deposited directly on a glass substrate at 400 and 700° C. (b) X-ray diffractograms of the layers of $SrVO_3/TiO_2$/glass having a thickness of 100 nm deposited between 450 and 600° C.

Glass, SrVO$_3$/HfO$_2$/Glass and SrVO$_3$/Cr$_2$O$_3$/Glass and a bare glass substrate used as a reference.

FIG. 12a represents the accelerated aging measurements carried out at a temperature of 250° C. and for 24 hours on thin films of SVO without a protective layer and with a protective layer of TiO$_2$ (deposited under vacuum and with a partial pressure of oxygen), LAO and Al2O$_3$.

In FIG. 12b, we have plotted the change in the resistivity without showing the curve of the SVO film without a protective layer in order to highlight the differences in behavior between the various protective layers.

FIG. 13 shows the X-ray diffraction diagrams of the SVO films without a protective layer and with a protective layer of TiO$_2$-O, TiO$_2$-vacuum, Al$_2$O$_3$ and LAO.

DEFINITIONS

To enable the invention to be understood, a certain number of terms and expressions are defined below:

For the purposes of the present invention, "independently" means that the substituents, atoms or groups to which this term refers, are chosen from the list of variables independently of one another (i.e., they may be identical or different).

As will be clearly apparent to a person skilled in the art, when the variables listed are grouped together into a group, as in a Markush grouping, the invention encompasses not only the group listed in its entirety, but each member of the group individually and all the possible sub-groups of the main group. Thus, it is understood that the invention encompasses not only the main group, but also the main group in the absence of one or more of the group members. The invention therefore provides for the explicit exclusion of one or more members of a given group. Accordingly, it is understood that disclaimers may apply to any one of the categories or embodiments disclosed herein, by virtue of which one or more of the elements, variants or embodiments stated may be excluded from the field claimed, for example by way of an explicit negative limitation.

DESCRIPTION OF CERTAIN ADVANTAGEOUS EMBODIMENTS OF THE INVENTION

As discussed above, there is a real need to develop a means enabling the crystallization of vanadate TCOs, and in general crystalline metal oxides of perovskite type, on any type of substrate, in particular unsuitable substrates such as glass.

The present invention addresses this need precisely by means of a buffer layer of a binary metal oxide promoting the crystal growth of crystalline metal oxides of perovskite type. In the present document, this buffer layer is also referred to as a layer (ii) of a crystalline binary metal oxide.

Thus, according to one aspect, the invention relates to a multilayer conductive system of metal oxides comprising:
  i. a substrate;
  ii. a layer of a crystalline binary metal oxide, deposited on the substrate (i); and
  iii. a layer of a crystalline metal oxide having a crystalline structure of perovskite type superposed over the layer of binary metal oxide (ii).

The binary metal oxide of the layer (ii) preferably has a local lattice mismatch of less than 5% with respect to the lattice of the metal oxide of the layer (iii). In general, the local lattice mismatch is preferably less than about 5%. This advantageously makes it possible to induce the transfer of the crystallinity of the crystalline binary metal oxide of the layer (ii) towards the growing crystalline conductive metal oxide of perovskite type (layer (iii)). "Local lattice mismatch" is understood to mean the difference between the interplanar spacings of the crystalline orientations of the film $(d_{hkl}^{(iii)})$ of the layer (iii) of metal oxide of perovskite type and of the binary oxide of the layer (ii) $(d_{hkl}^{(ii)})$ which are locally parallel (i.e., at the layer (ii)/layer (iii) interface). The local lattice mismatch d is calculated from the equation (1):

$$d = \frac{d_{hkl}^{(iii)} - d_{hkl}^{(ii)}}{d_{hkl}^{(ii)}} * 100 \tag{Eq. 1}$$

All of the interplanar spacings of a crystal can be directly measured by diffraction (for example X-ray diffraction) by virtue of Bragg's law. The lattice parameters, and interplanar spacings, of the crystalline metal oxides of perovskite type are known or can be determined by X-ray diffraction. The same is true for the crystalline binary metal oxides. Thus, depending on the metal oxide of perovskite type to be deposited in crystalline form in a thin layer, those skilled in the art will be able to select suitable binary metal oxides, having lattice parameters similar to those of the crystalline metal oxide of perovskite type of interest. Those skilled in the art may, in particular, choose binary metal oxides whose interplanar spacing of the crystalline orientations in the plane of the substrate (i.e., parallel to the substrate) differs by less than 5% from the interplanar spacing of the locally parallel crystalline orientations of the crystalline metal oxide of perovskite type (at the perovskite metal oxide/binary metal oxide interface).

Advantageously, the metal oxide of perovskite type of the layer (iii) may be a crystalline conductive metal oxide having a crystalline structure of perovskite type. This may be particularly advantageous for all applications requiring/involving electrical conduction such as optically transparent sensors or detectors, bioelectronic sensors or detectors, micro/nano-structuring of optical devices, but also screen technology for touch screens, solar cells, liquid crystal displays, light-emitting diodes, organic light-emitting diodes, heating devices for windows, mirrors or lenses, etc. According to one aspect, the present invention therefore belongs to the field of conductors and notably transparent conductors in the visible and near infrared range, and more particularly in the visible range. "Conductive metal oxide" means an electrically conductive metal oxide. In the context of the present invention, the expressions "conductor of electricity" and "conductor" are equivalent and may be used interchangeably. The conductive nature of a metal oxide of perovskite type according to the invention can be demonstrated and characterized using the four-point method (A, B, C, D) in a Van der Pauw configuration. Briefly, the resistance depending on the different terminals (A, B, C, D) of each voltage measured on the thin layer is calculated. An average resistance dependent on point A (average of the resistance of Vab, Vac and Vda) and point B (Vbc, Vcd and Vbd) called $R_A$ and $R_B$ are calculated. According to the Van der Pauw method, the surface resistance $R_S$ is deduced from solving the equation (2) by incorporating the values of $R_A$ and $R_B$:

$$\exp(-\pi\ R_A/R_S)+\exp(-\pi\ R_B/R_S)=1 \tag{Eq. 2}$$

The resistivity $\rho$ is calculated from the thickness e of the thin layer, by the equation (3):

$$\rho=R_S \cdot e \tag{Eq. 3}$$

A. Crystalline Conductive Metal Oxide of $ABO_3$ Perovskite Structure

Generally, the metal oxide of the layer (iii) can be any conductive metal oxide of perovskite structure of the formula $ABO_3$. The reader may, for example, refer to Ref 29 for instruction on the conductive metal oxides of perovskite structure with the formula $ABO_3$. It may be a conductive or semi-conductive metal oxide. For example, it may be $CaRuO_3$, $SrRuO_3$, $SrCrO_3$, $SrFeO_3$, $SrTiO_3$, $SrMoO_3$, $LaTiO_3$, $Sr_2VMoO_6$, $LaNiO_3$, highly conductive metal oxides of perovskite type. The conductive metal oxide used in the context of the present invention may be opaque or transparent in the visible and near infrared range. In the context of the present invention, "metal oxide transparent in the visible and near infrared range" means a metal oxide enabling the transmission of at least 70%, or even at least 80%, of a light having a wavelength of between about 400 and about 1400 nm and in particular between about 400 and about 800 nm, in particular when the metal oxide is deposited as a thin layer of a few hundred nanometers thick. The transparency of the material can be expressed by the value (T) of the transmission at a given wavelength in the visible and near infrared range (i.e., from 400 nm to 1400 nm), or in the visible range (i.e., from 400 nm to 800 nm). For example, the transparency of the material can be expressed by the value (T) of the transmission at 550 nm. Thus, a metal oxide will be so-called transparent in the visible and near infrared range, or in the visible range, if T≥70%, or even T≥80%, when exposed as a thin layer to light having a wavelength between 400-1400 nm, or 400-800 nm, respectively.

In the context of the present invention, "opaque in the visible and near infrared range" is understood to mean a metal oxide not enabling the transmission of light having a wavelength comprised between about 400 and about 1400 nm and in particular between about 400 and about 800 nm, in particular when the metal oxide is deposited as a thin layer of a few hundred nanometers thick. The transparency or opacity of a metal oxide can be determined by transmission spectroscopy by depositing the material as a thin film of 1-200 nm, or even 20-100 nm, in thickness, and by measuring the percentage of transmittance of incident light through the thin layer as a function of wavelength. Typically, a transmission measurement is also performed with the substrate or substrate/buffer layer (ii) only (without a thin layer (iii) of the metal oxide studied), then the values obtained on the sample (substrate/buffer layer (ii)/thin layer (iii)) are corrected in order to determine the transparency of the metal oxide of the layer (iii). The thickness of the thin layers of metal oxide can be determined by the usual methods, for example using a profilometer (for thicknesses from a few tens of nm to a few hundred nm), or by X-ray reflectometry (XRR) for thicknesses from a few nm to a hundred nm or by X-ray diffraction (XRD) for thicknesses from a few tens of nm to a few hundred nm. The thickness of the thin metal oxide layers can be adjusted when the thin layer is prepared, for example, by adjusting the number of laser pulses on the metal oxide precursor target, when the thin layer is deposited by pulsed laser ablation (see Examples).

Among the opaque conductive metal oxides of perovskite type, it is possible to mention for example $SrFeO_3$, $Sr_2VMoO_6$, $SrCrO_3$ and $SrTiO_3$ ($SrCrO_3$ and $SrTiO_3$ appear to become opaque in the conductive phase). It will however be noted that some recognize the $SrTiO_3/LaAlO_3$ bilayer as a transparent conductor. Thus, $SrTiO_3$ could be used as a transparent conductive metal oxide in the context of the present invention. In this case, it is preferable to use same as a very thin layer in order to ensure the optical transparency of the multilayer system (e.g. the thickness of the $SrTiO_3$ may be <10 nm).

Preference will be made to transparent conductive metal oxides in the visible and near infrared range of perovskite type. Thus, the conductive metal oxide used in the context of the present invention may be a transparent conductive oxide (TCO). The reader may for example refer to Ref 1 for instruction on the conductive transparent metal oxides of perovskite structure with the formula $ABO_3$. Preferably, the metal oxide of the layer (iii) may be any transparent conductive metal oxide of perovskite structure with the formula $ABO_3$ wherein A is selected from Sr or Ca optionally doped with La or another element from the groups of lanthanides such as Pr, Nd, and B is selected from V, Cr, Ti or Mo. It may, for example, be transparent metal oxides $SrVO_3$, $CaVO_3$, $SrMoO_3$ as well as solid solutions $(La,Sr)VO_3$ and $(La,Sr)CrO_3$, which are transparent conductors of perovskite type. It is understood that the transparent conductive metal oxide of the layer (iii) corresponding with the $ABO_3$ formula may be doped on the A-site with Ca, Sr, La, or other lanthanides; and/or on the B-site with Ti, Cr, Mo, or other transition metals. For example, $SrVO_3$, $SrCrO_3$ and $SrMoO_3$ may be doped with Ca, La, or other lanthanides on the "Sr" site. $CaVO_3$ may be doped on the "Ca" site with Sr, La, or other lanthanides and/or on the "V" site with Ti, Cr or Mo. The dopings can be adjusted to ensure the conductivity of the perovskite. For example, regarding $SrVO_3$, the doping ranges to be conductive may be x>0.26 in $La_{1-x}Sr_xVO_3$. Regarding $SrCrO_3$, the doping ranges to be conductive may be x>0.5 for $La_{1-x}Sr_xCrO_3$. Generally, the transparent conductive doped metal oxides of perovskite type are known, as well as the doping ranges adapted to obtain a conductive transparent metal oxide of perovskite type. Mention may be made, for example, of Refs 1, 30, 31.

The layer (iii) of transparent conductive metal oxide may have a thickness of 20 to 100 nm, preferably 20 to 70 nm, more preferentially 30 to 50 nm.

When the metal oxide of perovskite type of the layer (iii) is a crystalline transparent conductive metal oxide, the substrate (i) is preferably transparent and the thickness of the crystalline binary metal oxide layer (ii) is preferably <20 nm, preferably <10 nm, most preferentially 5-7 nm, in order to ensure the optical transparency of the multilayer system.

Advantageously, the layer (iii) of metal oxide of perovskite type may be covered, in whole or in part, by a protective layer (cp), preferably transparent. It may be a conductive metal oxide, such as $TiO_2$ or O-substoichiometric ZnO. In the present document, "$TiO_2$ or O-substoichiometric ZnO" refers to O-substoichiometric $TiO_2$ or O-substoichiometric ZnO. The stoichiometry of the $TiO_2$ or ZnO can be adjusted by adapting the amounts of starting compounds used for its synthesis. It may also be an insulating metal oxide, such as $Al_2O_3$, $SiO_2$ or $LaAlO_3$. Preference will be given to very thin protective layers (a few nanometers), for example 1-20 nm thick, preferably <10 nm, most preferentially 5-7 nm. Alternatively, it is possible to choose a method for depositing the protective layer (cp) that provides electrical contact openings in the protective layer (cp) in order to ensure the conductivity of the entire system.

Thus, a multilayer conductive system according to the invention can comprise a transparent substrate (i), a crystalline binary metal oxide layer (ii) having a thickness <20 nm, preferably <10 nm, most preferentially 5-7 nm, and a layer (iii) comprising a crystalline transparent conductive metal oxide of perovskite type, wherein the system further comprises a transparent layer (ct) superposed over the layer (iii) of conductive metal oxide, a metal oxide, preferably conductive, such as $TiO_2$ or O-substoichiometric ZnO, or an insulating oxide such as $Al_2O_3$, $SiO_2$ or $LaAlO_3$, the layer (ct) covering all or part of the layer (iii). When the layer (ct) completely covers the layer (iii) of transparent conductive metal oxide, a very thin layer (ct) may be preferred, to ensure the transparency of the system. Alternatively, the layer (ct) may cover a portion of the layer (iii), with the electrical contact openings in the transparent layer (ct) to ensure the conductivity of the assembly. This may be particularly advantageous when the layer (ct) comprises an insulating metal oxide such as $Al_2O_3$, $SiO_2$ or $LaAlO_3$. Since the main function of the layer (ct) is to serve as a protective layer, the layer (ct) may be crystalline or amorphous (the crystalline state is not essential).

The crystalline structure of the transparent conductive metal oxides of perovskite type does not necessarily correspond to the ideal cubic perovskite structure. These oxides can deviate from this ideal cubic structure depending on the chemical nature of the A and B cations, for example due to lattice distortion, rotation of the octahedra around an axis, etc. This may be the case, for example, for metal oxides doped on the A and/or B site, the substitution of one atom with another of a different nature and size may result in lattice distortion.

Thus, the binary metal oxide of the layer (ii) preferably crystallizes in the same type of network, with a lattice parameter very close to that of the metal oxide of perovskite type of the layer (iii). As discussed previously, the local lattice mismatch is preferably less than about 5%. Advantageously, the binary metal oxide of the layer (ii) will have a local lattice mismatch of less than 5% relative to that of the conductive transparent $ABO_3$ metal oxide of perovskite structure of the layer (iii). The binary metal oxide of the layer (ii) may, for example, be selected from $TiO_2$, $SnO_2$ or ZnO. Of course, the binary metal oxide layer (ii) will advantageously be deposited under suitable experimental conditions to enable the metal oxide to be deposited in crystalline form. For example, suitable temperature conditions will advantageously be used to promote the crystallization of the binary oxide on the substrate (i) (Ref 32). For example, if the binary oxide is $TiO_2$, the latter can be deposited by radiofrequency (RF) cathode sputtering at 600° C. This can be carried out, for example, by spraying a metal target of Ti in an $O_2$/Ar 10:90% mixture under a suitable pressure (e.g., $10^{-2}$ mbar). Substoichiometric $TiO_2$, which has the advantage of being conductive, can be prepared by adjusting the $O_2$ level. A layer (ii) of sub-stoichiometric $TiO_2$ may advantageously be implemented if a conductive layer (ii) is desired (e.g., in the case of ferroelectric oxides C detailed below).

Of course, the metal oxide layer (iii) of perovskite type will advantageously be deposited under suitable experimental conditions enabling the crystal growth of the perovskite metal oxide on the layer (ii) of crystalline binary metal oxide. For example, suitable temperature conditions will advantageously be used to promote the crystal growth of the perovskite metal oxide on the crystalline binary metal oxide. Ref 33 For example, the metal oxide of perovskite type may be $SrVO_3$. Its crystal growth on a crystalline binary oxide, such as $TiO_2$, can be carried out by pulsed laser ablation at a temperature of preferably ≥450° C., for example 450° C.-600° C., for example 460° C.-550° C., for example 500-550° C., or even around 500° C. This can be carried out for example by focusing a pulsed laser on an $Sr_2V_2O_7$ polycrystalline target prepared by standard solid-state reaction. The deposition rate (in A/pulse) can advantageously be adjusted according to the repetition frequency of the laser, the fluence on the target, the working pressure, and the target-substrate distance. (see Examples) The metal oxide of perovskite type can also, for example, be $CaVO_3$. In this case, it is possible, for example, to use a stoichiometric oxygen target (i.e., $CaVO_3$).

B. Manganite with Colossal Magnetoresistance of $Ln_{(1-x)}AxMnO_3$ Perovskite Structure Generally, the metal oxide of the layer (iii) can be any manganite with colossal magnetoresistance (CMR) of perovskite structure. The reader may for example refer to Ref 34 for instruction on the manganites with colossal magnetoresistance (CMR) of perovskite structure. The metal oxide of the layer (iii) may be any manganite with colossal magnetoresistance (CMR) of $Ln_{(1-x)}AxMnO_3$ perovskite structure wherein Ln represents a rare earth atom (La, Pr, Nd, etc.). Advantageously, A can be chosen from alkaline earth atoms (Ba, Sr, Ca, etc.). x represents the doping level of the alkaline earth in the CMR manganite. The Colossal Magnetoresistance Effect or CMR is a quantum effect observed in materials with strongly correlated electrons and in particular manganites, and manifests as a significant drop in the resistance observed under the application of an external magnetic field. Numerically, it is characterized by the equation (4):

$$MR = \Delta R/R_0 = (R_H - R_0)/R_0 \quad \text{(Eq. 4)}$$

where $R_0$ and $R_H$ represent the resistances of the sample at a given temperature respectively in the absence of a magnetic field and under a magnetic field H. The manganese oxides $Ln_{(1-x)}A_xMnO_3$ have the perovskite structure. This does not necessarily correspond to the ideal cubic perovskite structure. The structure of $Ln_{(1-x)}A_xMnO_3$ manganese oxides is most commonly of the orthorhombic type and can be described by a three-dimensional framework of $MnO_6$ octahedra sharing their vertices and forming cavities in which the $Ln^{3+}$ and $A^{2+}$ ions are inserted.

Thus, the binary metal oxide of the layer (ii) preferably crystallizes in the same type of network, with a lattice parameter very close to that of the metal oxide of perovskite type of the layer (iii). As discussed previously, the local lattice mismatch is preferably less than about 5%. Advantageously, the binary metal oxide of the layer (ii) will have a local lattice mismatch of less than 5% with respect to that of the $Ln_{(1-x)}A_xMnO_3$ manganese oxide of perovskite structure of the layer (iii). The binary metal oxide of the layer (ii) may, for example, be selected from $TiO_2$, $SnO_2$ or ZnO. As described in part A above, the binary metal oxide layer (ii) will advantageously be deposited under suitable experimental conditions to enable the metal oxide to be deposited in crystalline form.

It is understood that in CMR manganites with formula $Ln_{(1-x)}A_xMnO_3$ that can be used in the layer (iii), the A-site may be an alkaline earth atom, optionally doped with at least one other alkaline earth atom. It may, for example, be CMR manganites of the series x=0.30, for example $Pr_{0.70}Ca_{0.30-y}Sr_yMnO_3$, where y represents the Sr doping level (which may be zero), the resistance of which can be reduced by four to eleven orders of magnitude by applying a magnetic field of 6 T. Mention may be made, for example, of the CMR manganites $Pr_{0.70}Ca_{0.25}Sr_{0.05}MnO_3$ (y=0.05) and $Pr_{0.70}Ca_{0.26}Sr_{0.04}MnO_3$ (y=0.04). The manganites $La_{0.70}Ca_{0.30-y}Sr_yMnO_3$ and $Sm_{0.70}Ba_{0.30-y}Sr_yMnO_3$, where y represents the Sr doping level (which may be zero), may also be mentioned, for example $La_{0.70}Ca_{0.11}Sr_{0.9}MnO_3$ and $Sm_{0.70}Ba_{0.30}SrMnO_3$.

It can also be, for example, CMR manganites of the series x=0.34, for example manganites $Pr_{0.66}Ca_{0.34-y}Sr_yMnO_3$, where y represents the Sr doping level. Mention may, for example, be made of the CMR manganites $Pr_{0.70}Ca_{0.25}Sr_{0.05}MnO_3$ (y=0.05) and $Pr_{0.70}Ca_{0.26}Sr_{0.04}MnO_3$ (y=0.04).

Mention may also be made of the CMR manganites of the series x=0.50, for example of type $Ln_{0.5}Sr_{0.5-y}Ca_yMnO_3$, such as manganites $Pr_{0.5}Sr_{0.5-y}Ca_yMnO_3$, like $Pr_{0.50}Sr_{0.41}Ca_{0.09}MnO_3$.

It is understood that in CMR manganites with the formula $Ln_{(1-x)}A_xMnO_3$ that can be used in the layer (iii), the Mn site may optionally be doped, by a transition element such as chromium, cobalt or nickel. For example, CMR manganites of type $Ln_{(1-x)}A_xMn_{(1-k)}Cr_kO_3$ may be cited where k represents the Cr doping level on the Mn sites. It may, for example, be the manganite $Pr_{0.5}Ca0.5Mn_{(1-k)}Cr_kO_3$ where k may be comprised between 0.01 and 0.06 (e. g., k may be 0.01, 0.03, 0.04 or 0.06).

The metal oxide of the layer (iii) with the formula $Ln_{(1-x)}A_xMnO_3$ may advantageously be ferromagnetic, in particular at the operating temperature of the multilayer system according to the present invention.

In the case of CMR manganite systems, transparency is not necessary. The metal oxide of the layer (iii) with the formula $Ln_{(1-x)}A_xMnO_3$ may therefore be opaque. The same applies for the substrate (i) and the crystalline binary metal oxide layer (ii). The metal oxide layer (iii) with the formula $Ln_{(1-x)}A_xMnO_3$ may have a greater or lesser thickness. This thickness may vary over the substrate. However, a constant thickness over the entire substrate may be advantageous. In particular, this thickness may be comprised between 10 and 1000 nm, in particular between 20 and 800 nm, in particular between 50 and 600 nm, and more particularly, between 100 and 400 nm.

Due to the high sensitivity of CMR manganites to the magnetic field, the multilayer systems according to the present invention in which the metal oxide of the layer (iii) may be a CMR manganite with the formula $Ln_{(1-x)}A_xMnO_3$ as defined above generally and in different variants, may apply to the manufacture of sensors, for example for magnetic recording or magnetic storage of information.

C. Ferroelectric Metal Oxide of $ABO_3$ Perovskite Structure

Generally, the metal oxide of the layer (iii) may be any ferroelectric metal oxide of perovskite structure. The reader may for example refer to Ref 35 for instruction on the ferroelectric metal oxides of perovskite structure. The metal oxide of the layer (iii) may be any ferroelectric metal oxide of perovskite structure with the $ABO_3$ formula. For example, A can be chosen from Ba, Pb or K, and B may be chosen from Ti, Zr or Ta. Advantageously, A can be chosen from Ba or Pb, and B may be selected from Ti or Zr.

"Ferroelectric metal oxide" is understood to mean that the metal oxides have an intrinsic electric polarization, which can be switched from one direction to another by an external electric field. Most pyroelectric crystals have a spontaneous polarization $P_S$ in certain temperature ranges and the direction of this $P_S$ can be reversed by applying an external electric field. This character called "ferroelectric" is described by the polarization hysteresis loop as a function of the electric field applied. "Hysteresis" is understood to be the persistence of a phenomenon when the cause that triggered it has stopped.

Among the ferroelectric perovskites that can be used in the context of the present invention, mention may be made, for example, of $BaTiO_3$, $PbTiO_3$, $BaZrO_3$, $PbZrO$, $KNbO_3$ and $KTaO_3$. In particular, mention may be made of $BaTiO_3$, $PbTiO_3$, $BaZrO_3$ and $PbZrO_3$.

It is understood that in ferroelectric perovskites with the formula $ABO_3$ that can be used in the layer (iii), the B-site may optionally be doped by another atom. It may for example be $Pb(Zr,Ti)O_3$ (PZT).

Ferroelectric perovskites can undergo several phase transformations as a function of temperature. As a function of temperature, atomic displacements and lattice distortions can be observed. For example, potassium niobate $KNbO_3$ (or KNO) crystallizes in a rhombohedral network with polarization along an <111> axis in its fundamental state (low temperature, ≤263 K). Below its Curie temperature (708 K), $KNbO_3$ can adopt a tetragonal, orthorhombic, or rhombohedral structure, each promoting electric polarization along a different crystallographic axis. This is the case for ferroelectric perovskites in general (i.e., succession of phase transformations as a function of temperature, with a move towards a more symmetrical structure by increasing the temperature; $BaTiO_3$ shows, for example, a high-temperature cubic phase). Thus, in the case where the metal oxide of the layer (iii) is a ferroelectric perovskite with the formula $ABO_3$, the binary metal oxide of the layer (ii) preferably crystallizes in the same type of network, namely tetragonal, orthorhombic, or rhombohedral, depending on the operating temperature of the system. The binary metal oxide of the layer (ii) may for example be chosen from at least one of the following oxides: $TiO_2$, $SnO_2$, $ZnO$, $Y_2O_3$, $ZrO_2$, $HfO_2$ and $Cr_2O_3$. As described in part A above, the binary metal oxide layer (ii) will advantageously be deposited under suitable experimental conditions to enable the metal oxide to be deposited in crystalline form.

In the case of ferroelectric metal oxide systems, transparency is not necessary. Indeed, the use of an opaque substrate (i) and/or an opaque binary metal oxide layer (ii) does not prevent the primary applications of ferroelectric elements. The ferroelectric metal oxide of the layer (iii) with the formula $ABO_3$ may therefore be opaque. The same applies for the substrate (i) and the crystalline binary metal oxide layer (ii). It should however be noted that, in general, ferroelectric materials are transparent. Thus, the possibility of maintaining the transparency of the multilayer and of the substrate will advantageously make it possible to integrate the system into transparent electronics. It will also be noted that the transparency of the system imposes, on the other hand, an insulating substrate (there are no transparent conductive substrates); in this case, the use of a conductive binary metal oxide layer (ii) could be provided (e.g., $TiO_2$ or substoichiometric $ZnO$) or an additional conducting layer (iv) located between the substrate (i) and the layer (ii) of binary metal oxide (to enable a multilayer system to be produced where the ferroelectric metal oxide (iii) with formula $ABO_3$ is advantageously sandwiched between two conductive layers—see paragraphs below).

The ferroelectric metal oxide layer (iii) with the formula $ABO_3$ may have a greater or lesser thickness. This thickness may vary over the substrate. However, a constant thickness over the entire substrate may be advantageous. In particular, this thickness may be comprised between 10 and 1000 nm, in particular between 20 and 800 nm, in particular between 50 and 600 nm, and more particularly, between 100 and 400 nm.

On the other hand, in the case of ferroelectric metal oxide systems, the ferroelectric metal oxide layer (iii) with the formula $ABO_3$ is preferably sandwiched between two conductive layers. Thus, in one variant, in the multilayer conductive system according to the invention, the metal oxide of perovskite type of the layer (iii) can comprise a ferroelectric oxide (C), and the binary metal oxide of the layer (ii) can be a conductive binary metal oxide, the multilayer system further comprising a conductive layer (cc) superposed over the layer (iii). For example, the layer (ii) of the multilayer system according to the invention may preferably comprise a conductive binary metal oxide such as $TiO_2$ or O-substoichiometric ZnO. In addition, a conductive layer (cc) may advantageously be deposited on the layer of ferroelectric metal oxide (iii). Thus, when the metal oxide of perovskite type of the layer (iii) comprises a ferroelectric oxide, the layer (ii) may comprise a conductive binary metal oxide such as $TiO_2$ or O-substoichiometric ZnO, and the multilayer system may further comprise a conductive layer (cc) superposed over the layer (iii). The layers (ii) and (cc) may be composed of identical or different conductive materials.

In one variant, in the multilayer conductive system according to the invention, the metal oxide of perovskite type of the layer (iii) can comprise a ferroelectric oxide (C), and the binary metal oxide of the layer (ii) can be an insulating binary metal oxide, the multilayer system further comprising a conductive layer (cc) superposed over the layer (iii). In this case, the binary metal oxide layer (ii) will advantageously be thin (e.g., <10 nm), and the substrate (i) may advantageously be a conductive substrate, thus ensuring the sandwiching of the ferroelectric oxide (C) between two conducting layers (the conductive substrate and the conductive layer (cc) superposed over the layer (iii). For example, the conductive substrate (i) may be a silicon substrate or a conductive metal substrate.

In another variant, in the multilayer conductive system according to the invention, the metal oxide of perovskite type of the layer (iii) may comprise a ferroelectric oxide (C), and the binary metal oxide of the layer (ii) may be an insulating binary metal oxide, the multilayer system further comprising a conductive layer (cc) superposed over the layer (iii) and an insulating substrate (i) (e.g., transparent). In this case, the layer (ii) of binary metal oxide will advantageously be thin (e.g., <10 nm), and the system may further comprise an additional conductive layer (iv) located between the substrate (i) and the layer (ii) of binary metal oxide (to allow the production of a multilayer system where the ferroelectric metal oxide (iii) with the formula $ABO_3$ is advantageously sandwiched between two conductive layers).

In any of the preceding variants, the conductive layer (cc) can comprise a conductive material, such as:

a conductive metal oxide such as $TiO_2$ or O-substoichiometric ZnO;

a conductive perovskite oxide such as any of the conductive metal oxides of $ABO_3$ perovskite structure mentioned in part A) above. It may in particular be a highly conductive metal oxide of perovskite type such as $CaRuO_3$, $SrRuO_3$, $SrCrO_3$, $SrFeO_3$, $SrTiO_3$, $SrMoO_3$, $LaTiO_3$, $Sr_2VMoO_6$, $LaNiO_3$, or a crystalline transparent conductive metal oxide having the formula $ABO_3$ wherein A is selected from Sr or Ca optionally doped with La or another element from the groups of lanthanides, and B is selected from V, Cr, Ti or Mo, such as $SrVO_3$, $CaVO_3$, $SrCrO_3$, $SrTiO_3$, $SrMoO_3$; or—a conductive metal layer (e.g., Au, Ag, Al, etc.).

Due to their ferroelectric properties, the multilayer systems according to the present invention in which the metal oxide of the layer (iii) can be a ferroelectric metal oxide with the formula $ABO_3$ as defined above, generally and in different variants, can find numerous applications in microelectronics, such as the production of filters or capacitors whose properties can be adjusted with the chemical composition of the material. For example, the thin ferroelectric layers are widely used in the form of electrode/ferroelectric/electrode capacitors in non-volatile Ferroelectric Random Access Memories (FRAMs) and volatile Dynamic Random Access Memories (DRAMs). The layer (iii) can be deposited by any ferroelectric thin film production method known in the art. For example, it is possible to cite cathode sputter deposition, molecular beam epitaxy (MBE), or chemical vapor deposition (CVD) techniques such as metalorganic chemical vapor deposition (MOCVD), atomic layer deposition (ALD), or pulsed laser deposition (PLD).

Thus, according to one aspect, the present invention relates to a multilayer conductive system of metal oxides comprising:
i. a substrate;
ii. a layer of a crystalline binary metal oxide, deposited on the substrate (i); and
iii. a layer of a crystalline conductive metal oxide having a crystalline structure of perovskite type superposed over the layer of binary metal oxide (ii);
the binary metal oxide of the layer (ii) having a local lattice mismatch of less than 5% with respect to that of the metal oxide of the layer (iii);
provided that when the metal oxide of perovskite type of the layer (iii) is a crystalline transparent conductive metal oxide, the substrate (i) is transparent and the thickness of the crystalline binary metal oxide layer (ii) is <20 nm, preferably <10 nm, most preferentially 5-7 nm.

For the implementation of the present invention, the metal oxide of perovskite type of the layer (iii) can comprise:
A. a crystalline transparent conductive metal oxide of perovskite structure with the formula $ABO_3$ wherein A is selected from Sr or Ca optionally doped with La or another element from the groups of lanthanides, and B is selected from V, Cr, Ti or Mo;
B. a manganite with colossal magnetoresistance of perovskite structure with the formula $Ln_{(1-x)}A_xMnO_3$ wherein Ln represents a rare earth atom (La, Pr, Nd, etc.), A is selected from alkaline earth atoms (Ba, Sr, Ca, etc.) and x represents the doping level of the alkaline earths, or
C. a ferroelectric metal oxide of perovskite structure with the formula $ABO_3$, wherein A is selected from Ba, Pb or K, and B is selected from Ti, Zr or Ta, preferably A is selected from Ba or Pb, and B is selected from Ti or Zr.

The growth of the layer (iii) of metal oxide or perovskite type can be carried out at a temperature ≥400° C. For example, when the metal oxide of perovskite type is $SrVO_3$, the growth of the layer (iii) can be carried out at a temperature of preferably ≥450° C., for example 450° C.-600° C., for example 460° C.-550° C., for example 500-550° C., or even around 500° C.

When the metal oxide of perovskite type of the layer (iii) is a crystalline transparent conductive metal oxide, the substrate (i) is preferably transparent and the thickness of the crystalline binary metal oxide layer (ii) is preferably <20 nm, preferably <10 nm, most preferentially 5-7 nm, in order to ensure the optical transparency of the multilayer system.

In all cases, the crystalline binary metal oxide of the layer (ii) can be chosen from $TiO_2$, $SnO_2$ or $ZnO$, preferably $TiO_2$.

The conductive metal oxide layer (iii) may have a greater or lesser thickness. This thickness can be variable on the surface of the layer (ii) of binary metal oxide supported by the substrate. However, a constant thickness over the entire surface may be advantageous. In particular, unless otherwise specified, this thickness may be between 10 and 1000 nm, in particular between 20 and 800 nm, in particular between 50 and 600 nm and more particularly between 100 and 400 nm. In the case of a transparent multilayer conductive system (i.e., transparent substrate (i) and layer (iii)=transparent conductive metal oxide), the thickness of the layer (iii) may be thinner in order to have a good compromise between the optical transparency (the thinner the better) and the resistivity (the thicker the better). For example, a thickness of 20 to 100 nm, preferably 20 to 70 nm, more preferentially 30 to 50 nm, may advantageously be carried out.

Those skilled in the art know various techniques enabling the deposition of such a layer of a metal oxide on a support, said layer being in direct contact with the surface of the support. By way of illustrative and non-limiting examples, it is possible to cite thin film deposition techniques, such as cathode sputtering under vacuum, molecular beam epitaxy (MBE) or chemical vapor deposition (CVD) techniques such as metalorganic chemical vapor deposition (MOCVD), atomic layer deposition (ALD), or deposition by pulsed laser deposition (PLD). All of the aforementioned techniques are applicable to the deposition:
- of the layer (ii) of binary metal oxide on the substrate (i)
- of the layer (iii) of metal oxide of perovskite type on the layer (ii)
- of an optional protective layer (cp) on the layer (iii) or on the conductive layer (cc)
- of an optional conductive layer (cc) on the layer (iii) (see discussion above for ferroelectric metal oxides of perovskite type).

Substrate

Advantageously, the substrate (i) on which the different layers of material are deposited in the form of a thin layer, may be any suitable substrate. The substrate chosen will depend on the final format of the intended multilayer system, its preparation method, in particular the temperature applied for the manufacturing operations of the system (the substrate having to be adapted to the temperature to which it is subjected), and the intended application. Advantageously, the substrate may preferably be transparent, such as glass or a transparent plastic. This format is particularly suitable for an application requiring optical transparency of the system.

Any suitable substrate can be used in the context of the present invention, which may in particular be made of polymer(s) or be in the form of an inorganic layer. It may be a silicon substrate. Thus, the substrate (i) implemented in the context of the present invention, i.e., the substrate on the surface of which the different metal oxide layers are deposited, may be any natural or synthetic solid substrate, in particular used as a multilayer stack substrate of metal oxides.

Advantageously, the substrate used in the context of the present invention may be an insulating substrate (e.g., glass) or conductive or semi-conductive (e.g., silicon). A silicon substrate will be particularly advantageous for optoelectronic applications, especially integrated circuits.

Likewise, this substrate may be opaque or transparent in the visible and near infrared ranges. In the context of the present invention, "transparent substrate in the visible and near infrared range" means a substrate of a material enabling the transmission of at least 50%, in particular at least 60%, in particular, at least 70%, more particularly at least 80%, even more particularly at least 85%, or even at least 90%, of a light having a wavelength comprised between about 400 and about 1400 nm and in particular between about 400 and about 800 nm (visible domain).

More particularly, the substrate used in the context of the present invention may be a glass substrate or a polymer substrate transparent in the visible and near infrared ranges, such as a flexible polymer substrate transparent in the visible and near infrared ranges. The substrates made of flexible polymer transparent in the visible and near infrared range may be advantageous in, for example, applications such as flexible screens or solar panels. Thus, the substrate used in the context of the present invention may be made of a material selected from the group consisting of glass, a polycarbonate such as bisphenol A-based polycarbonate, a polyacrylate such as poly(methyl methacrylate), a polyamide such as nylon, a polyester such as polyethylene terephthalate (PET), a polyarylate, a polyetherimide, a sulfonic polymer, a polyether imide, a polyimide, a polynorbornene, an olefin polymer, a liquid crystal polymer (or LCP) such as polyether ether ketone (or PEEK), polyphenylene ether (or PPE) or polyphenylene oxide (or PPO) and a transparent thermosetting polymer.

Advantageously, the transparent substrate (i) may be transparent. Advantageously, the transparent substrate (i) may be an amorphous or crystalline transparent material having a temperature resistance of 500° C., such as glass.

Thus, the multilayer system according to the invention can be a multilayer transparent conductive system, and may comprise:
i. an optically transparent substrate, in particular in the visible and near infrared ranges, more particularly in the visible range;
ii. a layer of a crystalline binary metal oxide, deposited on the substrate (i); and
iii. a layer of a crystalline conductive metal oxide, optionally transparent in the visible and near infrared range, more particularly in the visible range, having a crystalline structure of perovskite type superposed over the binary metal oxide layer (ii);
the binary metal oxide of the layer (ii) having a local lattice mismatch of less than 5% with respect to that of the metal oxide of the layer (iii);
provided that when the metal oxide of perovskite type of the layer (iii) is a crystalline transparent conductive metal oxide, the substrate (i) is transparent and the thickness of the crystalline binary metal oxide layer (ii) is <20 nm, preferably <10 nm, most preferentially 5-7 nm.

Advantageously, such a multilayer conductive system may have an optical transparency in the visible range >70%, preferably ≥75%. This can be accomplished by using a substrate (i) and a layer (ii) of a crystalline conductive metal oxide of perovskite type, the substrate and the metal oxide being optically transparent in the visible and near infrared range, more particularly in the visible range. The crystalline transparent conductive metal oxide of perovskite type may be such as those described in part A for example.

Electronic Component

According to another aspect, the invention relates to an electronic component comprising a multilayer conductive system according to the invention, in any one of the variants described in the present description.

Preparation Method

According to another aspect, the invention relates to a method for preparing a multilayer conductive system according to the invention, comprising:
(a) depositing on a substrate (i), optionally transparent, a layer (ii) of a crystalline binary metal oxide; and
(b) the crystal growth of a layer (iii) of a crystalline conductive metal oxide on the layer (ii) of crystalline binary oxide obtained in step a), wherein the conductive metal oxide has a crystalline structure of perovskite type.

Advantageously, the binary metal oxide of step a) has a local lattice mismatch of less than 5% with respect to that of the crystalline conductive metal oxide of perovskite type of step b).

When the metal oxide of perovskite type of the layer of step b) is a crystalline transparent conductive metal oxide, the substrate of step a) can advantageously be transparent and the thickness of the crystalline binary metal oxide layer of step a) may preferably be <20 nm, preferably <10 nm, most preferentially 5-7 nm.

Advantageously, step a) can be carried out by a thin film deposition technique. For example, by way of illustration, it is possible to cite cathode sputtering under vacuum, molecular beam epitaxy (MBE), pulsed laser deposition (PLD) or chemical vapor deposition (CVD) techniques such as metalorganic chemical vapor deposition (MOCVD) or atomic layer deposition (ALD).

Advantageously, step b) can be carried out at a temperature ≥400° C., preferably by pulsed laser deposition (PLD), cathode sputtering under vacuum, molecular beam epitaxy or chemical vapor deposition techniques such as metalorganic chemical vapor deposition or atomic layer deposition, most preferentially by pulsed laser deposition or by cathode sputtering under vacuum. For example, when the metal oxide of perovskite type is $SrVO_3$, the growth of the layer (iii) can be carried out at a temperature of preferably ≥450° C., for example 450° C.-600° C., for example 460° C.-550° C., for example 500-550° C., or even around 500° C.

Stack with Crystalline Conductive Metal Oxide of $ABO_3$ Perovskite Structure (A) or CMR Manganite of $Ln_{(1-x)}A_xMnO_3$ Perovskite Structure (B)

Optionally, the method may further comprise a step (c) of coating the layer (iii) of conductive metal oxide obtained in b) with a protective layer (cp), optionally transparent.

The layer obtained in c) can cover all or part of the conductive metal oxide layer obtained in b). In other words, the layer obtained in c) can completely cover the conductive metal oxide layer obtained in b). Alternatively, the layer of step c) can be carried out by providing electrical contact openings in the protective layer (cp) to ensure the conductivity of the assembly.

This may advantageously be envisaged in the case of multilayer systems according to the invention where the layer (iii) of metal oxide comprises a conductive metal oxide of perovskite structure with the formula $ABO_3$, transparent or opaque, such as those detailed in part A, or else a CMR manganite of perovskite structure with the formula $Ln_{(1-x)}A_xMnO_3$, such as those detailed in part B.

Advantageously, the protective layer (cp) may comprise a metal oxide, preferably conductive, such as $TiO_2$ or O-substoichiometric ZnO, or an insulating oxide such as $Al_2O_3$, $SiO_2$ and $LaAlO_3$. This may advantageously be envisaged in the case of multilayer systems according to the invention where the layer (iii) of metal oxide comprises a transparent conductive metal oxide of perovskite structure with the formula $ABO_3$, such as those detailed in part A.

Stack with $ABO_3$ Structure Ferroelectric Perovskite (C)

Optionally, the method may further comprise a step (b1) of coating the conductive metal oxide layer (iii) obtained in b) with a conductive layer (cc). This will be particularly advantageous in the case where the conductive metal oxide is an $ABO_3$ structure ferroelectric perovskite, such as those detailed in part C. For the choice of material for the conductive layer (cc) and its implementation, reference may be made to part C "Ferroelectric oxide of $ABO_3$ perovskite structure" detailed above.

Optionally, the method may further comprise a step (c1) of coating the conductive layer (cc) obtained in b1) with a protective layer (cp). The layer obtained in c1) can cover all or part of the conductive layer (cc) obtained in b1). In other words, the layer obtained in c1) can completely cover the conductive layer (cc) obtained in b1). Alternatively, the layer of step c1) can be carried out by providing electrical contact openings in the protective layer (cp) to ensure the conductivity of the assembly.

Protective Layer (cp)

Thus, regardless of the type of stack considered (system using A) a crystalline conductive metal oxide of $ABO_3$ perovskite structure, B) a CMR manganite of $Ln_{(1-x)}A_xMnO_3$ perovskite structure, or else C) a ferroelectric metal oxide of $ABO_3$ perovskite structure), a protective layer (cp) can be deposited on the multilayer stack covering the substrate. The protective layer (cp) may be made of insulating material, semiconductive (e.g., an n-type or p-type semiconductor) or conductive depending on the targeted application. In the case of an insulating material, the implementation of the protective layer (cp) can be carried out by providing electrical contact openings in the protective layer (cp) to ensure the conductivity of the assembly, for example by affixing one or more covers on the surface of the layer to be covered with the protective layer (cp), said covers being able to be removed once the protective layer (cp) has been deposited. As examples of materials capable of being deposited on the layer (iii) of conductive metal oxide of perovskite type, mention may be made, for example, of titanium oxide ($TiO_2$) optionally doped, optionally doped zinc oxide (ZnO), silicon oxide ($SiO_2$), $Al_2O_3$, $LaAlO_3$, nickel oxide (NiO), optionally doped indium oxide, optionally doped tin oxide, optionally doped cadmium oxide, optionally doped gallium oxide, optionally doped thallium oxide, optionally doped lead oxide, optionally doped antimony oxide, optionally doped magnesium oxide, optionally doped niobium oxide, optionally doped tungsten oxide, zirconium oxide and mixtures thereof; graphite fluoride; silicon nitride; an organic material, especially selected from the group consisting of polymers. The polymer to produce the protective layer (cp) may, for example, be a polymer transparent in the visible and near infrared range, such as a substrate made of a flexible polymer transparent in the visible and near infrared range. The polymer may be chosen, for example, from a polycarbonate such as bisphenol A-based polycarbonate, a polyacrylate such as poly(methyl methacrylate), a polyamide such as nylon, a polyester such as polyethylene terephthalate (PET), a polyarylate, a polyetherimide, a sulfonic polymer, a polyether imide, a polyimide, a polynorbornene, an olefin polymer, a liquid crystal polymer (or LCP) such as poly ether ketone (or PEEK), polyphenylene ether (or PPE) or polyphenylene oxide (or PPO) and a transparent thermosetting polymer.

Those skilled in the art know various protocols to deposit a layer of material as defined above on a conductive metal oxide layer. By way of illustrative and non-limiting examples of such protocols, mention may be made of spin-coating, casting, electrografting, chemical grafting and deposition by evaporation.

Uses

The multilayer system according to the invention can advantageously be used in a variety of applications, in particular in any field of application of:
  crystalline conductive metal oxides of perovskite structure with the formula $ABO_3$, transparent or opaque, such as those detailed in part A);
  colossal magnetoresistance manganites of perovskite structure with the formula $Ln_{(1-x)}A_xMnO_3$ such as those detailed in part B); and/or
  ferroelectric metal oxides of perovskite structure with the formula $ABO_3$ such as those detailed in part C).

Thus, a multilayer conductive system according to the invention may be used in particular:
  in optoelectronics;
  in solar technologies such as solar cells or panels;
  in sensor technology, such as touch sensors;
  in display technologies such as liquid crystal screens, flat screens, plasma screens, and touch screens;
  in infrared reflective coatings such as infrared filters/mirrors or glazing/glazing units with low emissivity;
  in electromagnetic shielding;
  in transparent electronics;
  in integrated antennas; and/or
  in conductive substrates for integrated circuits.

By way of examples, the present invention can be implemented in the solar cell industry and in the electronics industry in order to manufacture front faces or rear faces of flat screen type emissive screens, so-called plasma screens or else touch screens and more generally any type of screen/glazing capable of receiving, transmitting or emitting radiation, in particular visible light.

According to another aspect, the present invention relates to the use of a thin layer of crystalline binary metal oxide as a seed layer for the crystal growth of a metal oxide having a crystalline structure of perovskite type, the binary metal oxide having a local lattice mismatch of less than 5% with respect to the lattice of the metal oxide of perovskite type. In other words, the present invention also relates to a method for crystal growth of a metal oxide having a crystalline structure of perovskite type, comprising the use of a binary metal oxide layer as a seed layer, the binary metal oxide having a local lattice mismatch of less than 5% with respect to the lattice of the metal oxide of perovskite type. The metal oxide of perovskite type can be chosen from:
  crystalline conductive metal oxides of perovskite structure with the formula $ABO_3$, transparent or opaque, such as those detailed in part A);
  colossal magnetoresistance manganites of perovskite structure with the formula $Ln_{(1-x)}A_xMnO_3$ such as those detailed in part B); or
  ferroelectric metal oxides of perovskite structure with the formula $ABO_3$ such as those detailed in part C).

EQUIVALENTS

The following representative examples are intended to illustrate the invention and are not intended to limit the scope of the invention, nor must be interpreted as such. Indeed, various modifications of the invention and numerous other embodiments thereof, in addition to those presented and described herein, will be evident to the person skilled in the art from all of the contents of this document, including the following examples.

The following examples contain important additional exemplificative and instructive information that can be adapted to the practice of this invention in its various embodiments and equivalents thereof.

The following examples are provided for information only and without any limiting character of the invention.

Other advantages to those disclosed in the present application may also be apparent to those skilled in the art upon reading the examples below, given by way of illustration.

EXAMPLES

Those skilled in the art have a solid literature in the chemistry of metal oxides of perovskite type of which they can take advantage, in combination with the information contained in this document, for teachings on the synthesis methods and characterization of metal oxides of perovskite type, in particular transparent conductive metal oxides of this family of perovskites, which can be used in the implementation of the present invention.

The references cited in the present document provide general information useful to the preparation and characterization of metal oxides of perovskite type, and their thin-film format.

In addition, those skilled in the art may refer to the teaching and specific examples provided herein, relating to various embodiments of thin layers of conductive transparent metal oxide of perovskite type, in order to implement the present invention to its full extent.

Example 1: $SrVO_3$ Thin Films $SrVO_3$ thin films were deposited on Eagle XG Corning® glass substrates of dimension $5\times5$ mm$^2$ and 0.5 mm thick. Before treatment, the substrates were cleaned beforehand in an ultrasonic bath of acetone and then ethanol. A buffer layer of $TiO_2$ having a thickness of 5 nm was then deposited by radiofrequency (RF) cathode sputtering at 600° C. by spraying a metal target of Ti in an $O_2$/Ar 10:90% mixture under a pressure of $10^{-2}$ mbar. The power injected on the target was equal to 1 W·cm$^{-2}$ and the target-substrate distance was set at 4 cm. The $SrVO_3$ layer was then deposited by pulsed laser deposition in an ultimate vacuum of $1\times10^{-7}$ mbar by focusing an excimer laser KrF ($\lambda$=245 nm) on an $Sr_2V_2O_7$ polycrystalline target prepared by standard solid-state reaction. The repetition frequency of the laser was 3 Hz and the fluence on the target was 1.6 J·cm$^{-2}$. The working pressure was equal to $1\times10^{-6}$ mbar. The target-substrate distance was set at 5 cm and corresponds, under these conditions, to a deposition rate of 0.09 Å/pulse.

In order to study their structural properties, the thickness of the $SrVO_3$ films was initially set at 100 nm by adjusting the number of laser pulses on the target.

The influence of the growth temperature was studied by heating the substrate between 400 and 600° C. by means of a halogen lamp placed under the substrate holder.

In order to verify the role of the $TiO_2$ buffer layer, two 80 nm-thick $SrVO_3$ films were deposited directly on glass at 400 and 600° C. In a second step, the thickness of the $SrVO_3$ films was reduced to 20 nm in order to increase the optical transmission of the films, while avoiding significant degradation of the conductivity for smaller thicknesses (Ref. 1).

The structural properties and thicknesses of the films deposited were checked by X-ray diffraction (XRD) using a Bruker D8 Discover diffractometer operating with a Cu $K_{\alpha 1}$ monochromatic beam ($\lambda$=1.5406 Å).

The transport properties were studied between 5 and 300 K using the four-point method in a Van der Pauw configuration by means of a Quantum Design PPMS (Physical Properties Measurement System).

In order to determine the concentration and mobility of the carriers, Hall measurements were carried out in the same temperature range by applying a magnetic field varying between −9 and 9 T perpendicularly to the plane of the film.

The optical transmission of the samples was measured in the UV-visible-near infrared range using a Perkin-Elmer Lambda 1050 spectrophotometer between 350 nm and 850 nm. A virgin Eagle XG Corning® glass substrate was used as a reference for all optical measurements.

Results

Structure of the $SrVO_3$ Layers

The diffractograms of the 80 nm-thick $SrVO_3$ thin films deposited directly on glass substrates at 400 and 600° C. are reported in FIG. 1a. The absence of diffraction peaks shows that the layers remain amorphous regardless of the deposition temperature. For 100 nm-thick films deposited on $TiO_2$ between 450 and 600° C. (FIG. 1b), the diffractograms indicate that crystallization occurs between 450 and 500° C. At 450° C., no diffraction peak is detectable, which means that the temperature is not high enough to induce crystallization of the $SrVO_3$ film even in the presence of the $TiO_2$ buffer layer. Furthermore, the thickness of $TiO_2$ (5 nm) is too thin to cause the appearance of diffraction peaks in the XRD measurements, but the crystal growth of the $SrVO_3$ above indicates the crystalline character of the buffer layer. At 500° C., the characteristic peaks of the $SrVO_3$ cubic perovskite phase (Pm$\bar{3}$m space group) (Ref. 2) appear with the most intense reflections (110) and (211) observed respectively at 32.81(2) and 58.71(1)°. Consequently, the film has a polycrystalline structure induced by the polycrystalline nature of the $TiO_2$ buffer layer. The polycrystalline structure of the $SrVO_3$ layer is confirmed at 550° C. with the appearance of other characteristic reflections (111), (002) and (220) observed at 40.51(8), 47.05(8) and 68.93(3)° and which may be attributed to the $SrVO_3$ phase. However, the appearance of a parasitic peak at 28.90(9)° indicates the presence of an impurity attributed to the $Sr_2V_2O_7$ overoxidized phase. The stability of the intensity of this peak in comparison with the main peak (011) of $SrVO_3$ indicates that the $Sr_2V_2O_7$ phase does not tend to grow more with the deposition temperature. The presence of this phase only competes with the growth of $SrVO_3$ at high temperatures and indicates that an oxidation regime of $SrVO_3$ probably occurs due to the diffusion of oxygen from the layer of $TiO_2$ towards $SrVO_3$. This is a thermally activated process sufficient to form traces of $Sr_2V_2O_7$ but limited given the thin thickness of $TiO_2$. The $Sr_2V_2O_7$ phase appears from 550° C. and is not observed at 500° C. where only the $SrVO_3$ phase is detected.

The cubic lattice parameter $a_c$ of the polycrystalline $SrVO_3$ layers is comprised between 0.384(9) and 0.385(1) nm and seems to be independent of the film growth temperature. These values are similar to the value reported by Range et al. ($a_c$=3.84(0) nm) for bulk $SrVO_3$ prepared by solid-state reaction (Ref. 2). In general, the epitaxial stabilization necessary for the crystallization of $SrVO_3$ on a suitable single-crystal substrate systematically results in the appearance of epitaxial stress and positive or negative deformation outside the plane of the $SrVO_3$ lattice according to the deviation in the consistency of the film-substrate parameters (Ref. 3). Although $SrVO_3/TiO_2$/glass is deposited in the form of a thin layer, the crystalline structure of $SrVO_3$ is herein independent of the nature of the substrate and the parameter $a_c$ similar to that measured for the bulk material. Furthermore, the non-textured polycrystalline structure of $SrVO_3$ induced by the buffer layer of $TiO_2$ promotes short-distance relief of the residual stresses. The use of a $TiO_2$ seed layer for the growth of $SrVO_3$ therefore advantageously makes it possible to limit the effects normally induced by the substrate on the structure and the electrical and optical properties (Ref. 3).

Transport in the $SrVO_3$ Layers

Figure 2:
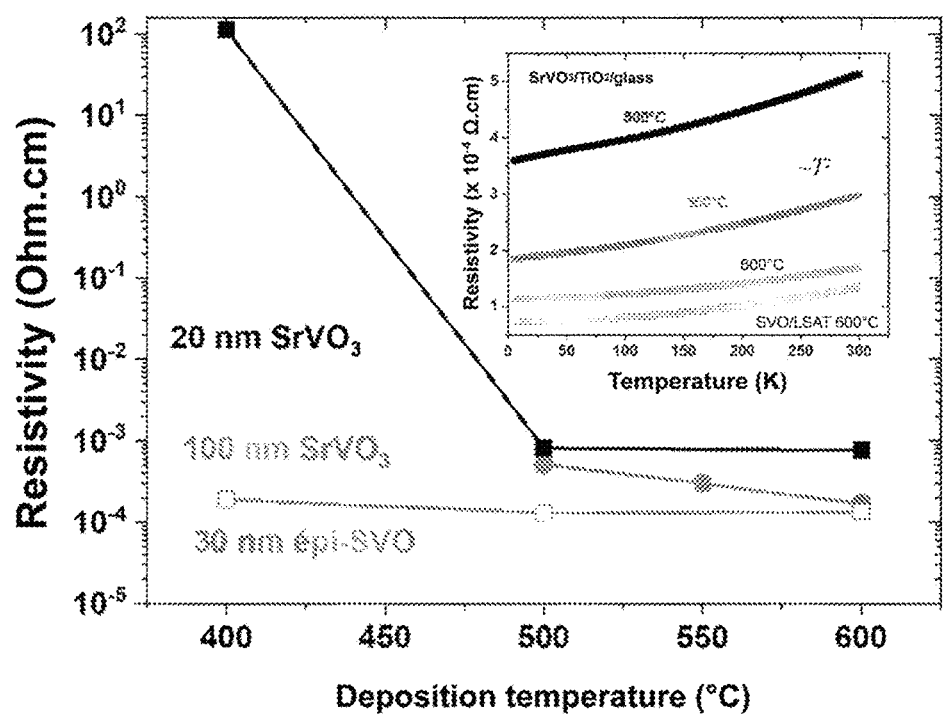
FIG. 2 shows: Resistivity at 300 K as a function of the deposition temperature of the polycrystalline films of $SrVO_3$ deposited on a $TiO_2$ buffer layer having a thickness of 100 nm (gray circles) and 20 nm (black squares), and comparison with layers of single-crystal $SrVO_3$ (30 nm, empty squares). The insert to the figure shows the temperature dependence of resistivity showing the metallic behavior as $T^2$ of the 100 nm-thick polycrystalline $SrVO_3$ films and compared with an epi-$SrVO_3$/LSAT deposited at 600° C.

The resistivities of the polycrystalline layers measured at 300 K are reported in FIG. 2 as a function of the growth temperature. The values are compared with the resistivity of 30 nm-thick epitaxial $SrVO_3$ single-crystal films on a single-crystal substrate and deposited under the same growth conditions (Ref. 4). The resistivity of $SrVO_3/TiO_2$ films having a thickness of 100 nm is comprised between 1.68 and 5.12×10$^{-4}$ Ω·cm. These values are excellent and are close to the resistivity of 30 nm-thick single-crystal films on LSAT (1.30 to 1.87×10$^{-4}$ Ω·cm). The metal nature of the layers is confirmed by the insert curves which show the change in the resistivity as a function of temperature. For the entire series, the resistivity follows a ~$T^2$ dependency characteristic of a transport regime dominated by an electro-electron diffusion process in a correlated metal type system such as $Ca_{1-x}Sr_xVO_3$ (Ref. 5). Furthermore, the curves clearly show a decrease in the resistivity of the layers as the growth temperature increases. This effect is attributed to the improved crystallinity of the $SrVO_3$ layer with the growth temperature in accordance with the XRD analyses (FIG. 1b) which show an increase in the intensity of the peak (111) of the $SrVO_3$ phase with temperature. The presence of the overoxidized $Sr_2V_2O_7$ parasitic phase observed at 500 and 600° C. is known to have an insulating nature (Ref. 6) but does not appear to significantly affect the transport in the $SrVO_3$ layers deposited at these temperatures. The improved crystallinity and percolation between the $SrVO_3$ grains are actually enough to observe a decrease in resistivity with temperature.

The reduction in the thickness of the layers from 100 to 20 nm is accompanied by a significant increase in resistivity. For example, ρ changes from 5.13 to 8.08×10$^{-4}$ Ω·cm at 500° C. and from 1.68 to 7.66×10$^{-4}$ Ω·cm at 600° C. The effect of the thickness on conductivity has been widely observed and studied in the literature for single-crystal $SrVO_3$ layers. It is accepted that the increase in ρ with the decrease in thickness is attributed to a change in the conduction regime that induces an insulator transition below a threshold thickness (Refs. 7, 8). Similarly, the comparison of the resistivity of the 20 nm $SrVO_3/TiO_2$ polycrystalline films with SrVO$_3$ films having a similar epitaxial thickness (30 nm) on an LSAT (lanthanum aluminate-strontium aluminum tantalate) substrate results in an increase in ρ but which, in this case, is due to the incorporation of numerous grain boundaries in the microstructure of the SrVO$_3$ layer and decreasing carrier mobility. Moreover, the resistivity of the film deposited on TiO$_2$/glass at 400° C. which is equal to ρ=122 Ω·cm confirms the insulating nature of the amorphous structure of the SrVO$_3$. The single-crystal layer of SrVO$_3$ deposited on LSAT under the same conditions is conductive, which is explained by the fact that SrVO$_3$ crystallization stabilized by LSAT occurs from 400° C. (Ref. 4).

Overall, the resistivities of the polycrystalline SrVO$_3$ layers on the TiO$_2$/glass buffer layer are excellent and largely meet the requirements for a polycrystalline TCO. For example, the SrVO$_3$ layer integrated at low temperatures (500° C.) which is the most suitable from a technological perspective for transfer over thermally-sensitive substrates (glass, silicon, etc.) therefore has a resistivity of 8.08×10$^{-4}$ Ω·cm. Its resistivity is comparable to conventional polycrystalline TCOs: ITO (1.5×10$^{-4}$ Ω·cm (Ref. 9)), SnO$_2$:F (2.2 to 70×10$^{-4}$ Ω·cm (Refs. 10, 11)), doped ZnO (2.7 to 56.5×10$^{-4}$ Ω·cm (Refs. 12, 13)) or doped TiO$_2$ (4.8 to 8.7×10$^{-4}$ Ω·cm (Refs. 14, 15)).

Figure 3A:
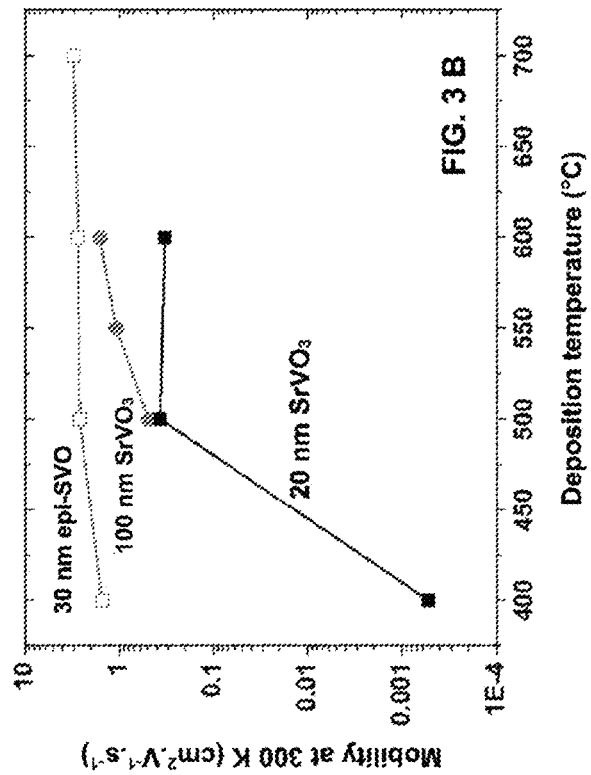
FIG. 3 shows: Density (a) and mobility (b) of the carriers at 300 K for the polycrystalline films of $SrVO_3$ deposited on a $TiO_2$ buffer layer having a thickness of 100 nm (gray circles) and 20 nm (black squares), and comparison with the single-crystal layers of $SrVO_3$ (open squares).

Correlated metals such as SrVO$_3$ are special in that they have a very high carrier density (~2.2×10$^{22}$ cm$^{-3}$) in comparison to wide band-gap semi-conductor TCOs, such as ITO, the concentration of which does not exceed 3×10$^{21}$ cm$^{-3}$ in the most favorable cases (Ref. 16). A high number of carriers has the advantage of increasing conductivity, but also the disadvantage of reducing the transparency of the material by shifting the plasma frequency from infrared to the visible range. In the case of vanadates, this compromise between conductivity and transparency is achieved. The carrier density measured at 300 K in polycrystalline SrVO$_3$ films on TiO$_2$ is between 1.95 and 2.50×10$^{22}$ cm$^{-3}$ (FIG. 3a). These values are ideally dispersed around the theoretical value (~2.2×10$^{22}$ cm$^{-3}$). Only the amorphous SrVO$_3$/TiO$_2$/glass film deposited at 400° C. has a carrier density significantly lower than this value (1.05×10$^{20}$ cm$^{-3}$) which confirms the insulating behavior previously measured (FIG. 2). The carrier densities of the polycrystalline SrVO$_3$ films are slightly greater than the values measured in single-crystal films.

Figure 3B:
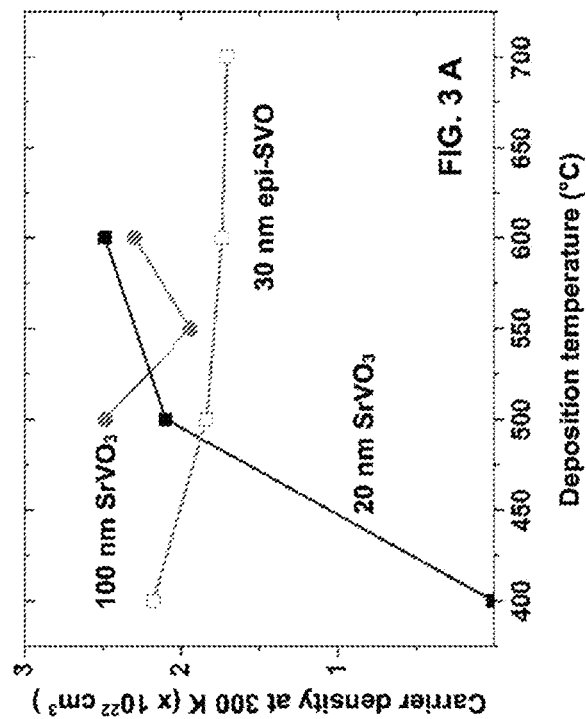

The mobility of the charge carriers measured at 300 K is reported in FIG. 3b as a function of the deposition temperature. For samples of comparable thicknesses, the mobility of the polycrystalline films is approximately one order of magnitude less than that measured in single-crystal films. For example, the mobility changes from 2.63 to 0.37 cm$^2$·V$^{-1}$·s$^{-1}$ for SrVO$_3$ at 500° C. In contrast to single-crystal epitaxial films, the presence of grain boundaries in the polycrystalline structure limits the delocalization of electrons in the crystal structure and leads to reduced carrier mobility. Furthermore, the increase in mobility with the deposition temperature indicates that the structural quality of the layers improves at higher temperatures. This observation is consistent with the XRD measurements which show an increase in the crystallinity of SrVO$_3$ between 500 and 600° C. (FIG. 1b). Only the amorphous SrVO$_3$/TiO$_2$ sample deposited at 400° C. has, as expected, a mobility well below the expected requirements for a TCO.

Optical Transmission of the SrVO$_3$ Layers

Figures 4A, 4B:
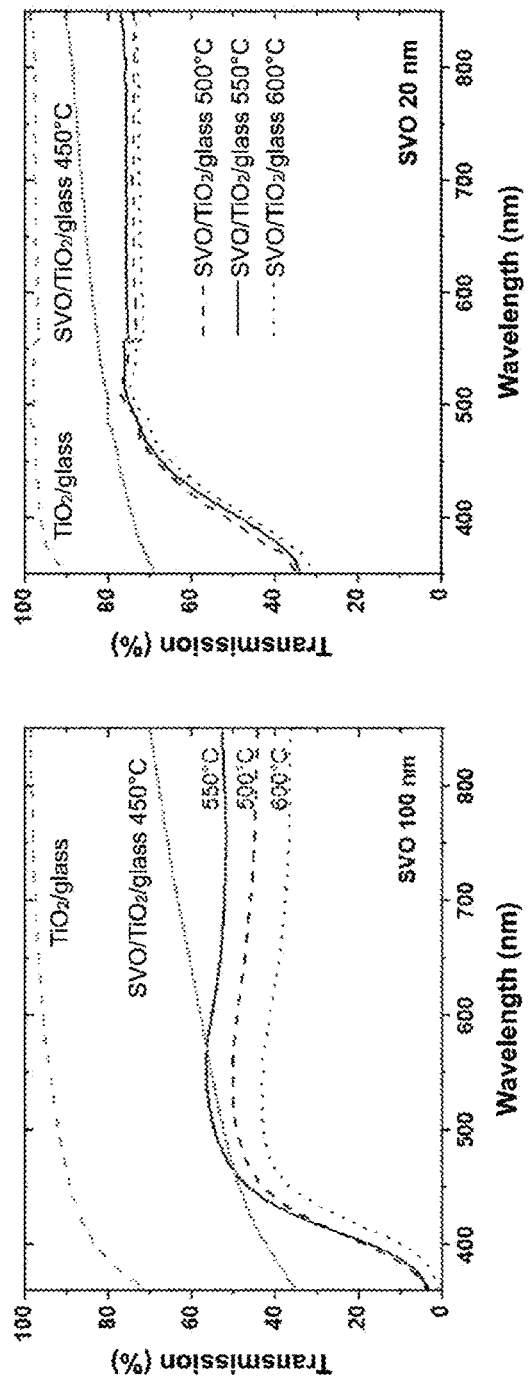
FIG. 4 shows: Transmission spectra in the visible range of the thin films of $SrVO_3/TiO_2$/glass and $TiO_2$/glass as a function of the deposition temperature for layers of $SrVO_3$ having a thickness of 100 nm (a) and 20 nm (b).

The transmission spectra of SrVO$_3$/TiO$_2$/glass films and an uncoated TiO$_2$/glass substrate were measured by UV-Visible-NIR spectrophotometry between 350 and 850 nm. The spectra are reported in FIGS. 4a and 4b. The TiO$_2$/glass sample has a transmission greater than 80% in the entire visible range, which has little influence on the overall transmission of the samples once coated with SrVO$_3$. The 100 nm SrVO$_3$/TiO$_2$/glass films have a transmission comprised between 35% and 50% (FIG. 4a). It is interesting to note that the film deposited at 600° C. is the least transparent and that maximum transmission is achieved for the film deposited at 500° C. The reduction in the thickness of the SrVO$_3$ layer to 20 nm (FIG. 4b) results in a significant increase in transmission which then reaches a plateau at 75% between 450 and 850 nm. The transmission no longer depends on the growth temperature of the layer. In this case, the transparency of the thinner layers becomes comparable to the transmission values typically measured for conventional polycrystalline TCOs (In$_2$O$_3$:Sn, SnO$_2$:F, ZnO:Al, etc.) and located around 80% (Ref. 17).

In order to estimate the performance of a TCO by considering both its conductive and transparent behavior, it is useful to calculate the figure of merit $\Phi_{TC}=T^{10}/R_{squared}$ where T is the transmission measured at the center of the visible spectrum at 550 nm and R$_{squared}$ is the resistance per square of the layer (Ref. 18). The figure of merit of the films is plotted as a function of the thickness (FIG. 5) and compared to different values reported in the literature for single-crystal SVO (Ref. 1) and other standard TCOs.

The figure of merit of 100 nm-thick SrVO$_3$/TiO$_2$/glass films (black squares, FIG. 5) is comparable to that of a polycrystalline ITO deposited on glass or on a flexible substrate such as polyethylene terephthalate (PET). Despite a transmission below 60% (FIG. 4a), their excellent conductivity makes it possible to achieve an interesting figure of merit. For example, $\Phi_{TC}$=5.54×10$^{-4}$ Ω$^{-1}$ for the layer deposited at 550° C., which rivals the poly-ITO on glass (gray squares). The figure of merit of the layers deposited at 500 and 600° C. is significantly lower because the reduction in transmission of only 10 to 15% for these two samples is amplified by the exponent T$^{40}$ in the calculation of $\Phi_{TC}$. The 20 nm films of SrVO$_3$/TiO$_2$/glass have a $\Phi_{TC}$ approximately equal to 5.54×10$^{-4}$ Ω$^{-1}$ (black circles) which is one order of magnitude less than the epitaxial single-crystal films (1.56×10$^{-3}$ Ω$^{-1}$ (Ref. 1)) but remains comparable to conventional polycrystalline TCO layers. This is explained by the polycrystalline structure of the SrVO$_3$ layers on TiO$_2$. As previously demonstrated, the presence of grain boundaries that opposes electronic delocalization is accompanied by a significant drop in carrier mobility compared to the mobility in the single-crystal layers (FIG. 3b). This behavior is obviously observed in an identical manner between the poly-ITO (gray squares) and epi-ITO (gray triangles) layers.

The above examples have demonstrated that a thin (5 nm) polycrystalline buffer layer composed of TiO$_2$ binary metal oxide is capable of inducing the crystallization of the SVO perovskite structure. It is observed that TiO$_2$ crystallizes on amorphous substrates such as glass even at low temperatures and has a transmission greater than 80% in the visible spectrum, which does not hinder the optical properties of vanadates. This buffer layer is relatively simple to implement with the thin film deposition techniques usually used in industry and consequently represents a low-cost method.

In the examples, it has been shown that the polycrystalline SVO films (strontium vanadate) stabilized by virtue of a buffer layer of TiO$_2$ deposited on glass have optical and electrical properties comparable to those of ITO. Considering the absence of indium, which makes it possible to reduce the cost of the material five-fold whilst retaining the properties expected for a standard TCO, the growth of SVO on glass therefore makes it possible to tangibly consider the potential applications for this new TCO.

Conclusion—Example 1

In the absence of a buffer layer, the spontaneous crystallization of $SrVO_3$ on glass by pulsed laser ablation is impossible. Furthermore, it is known that, unlike amorphous ITO, the layers of $SrVO_3$ must always be crystallized in order to be conductive. The use of a polycrystalline buffer layer of the order of 5 nm thick composed of $TiO_2$ binary metal oxide induces the crystallization of $SrVO_3$ from 500° C. This buffer layer is easy to deposit at low temperatures on amorphous substrates such as glass using standard deposition techniques (PLD, PVD, ALD, etc.). The layers of $SrVO_3$ synthesized are polycrystalline and have excellent conductive properties comparable to conventional polycrystalline TCOs. For example, a resistivity of $8.08 \times 10^{-4}$ $\Omega \cdot cm$ is obtained for 20 nm of $SrVO_3$ deposited at 500° C. In contrast to single-crystal layers, transport in the polycrystalline layers is not influenced by the nature of the substrate but only by the presence of grain boundaries and by the deposition conditions. The integration and reproducibility of the synthesized layers is therefore industrially simpler to implement. Finally, the transmission of 20 nm (~75%) layers is also excellent and comparable to conventional TCO transparency such as ITO or doped ZnO (~80%). In conclusion, it has been demonstrated through the examples that the use of a $TiO_2$ buffer layer induces the growth of $SrVO_3$ at moderate temperatures on unsuitable substrates such as glass or silicon, which are, however, essential for the type of applications targeted (conductive slabs, solar roof tiles, shielding, etc.). The technological obstacle related to their integration is thus overcome and will, in the future, make it possible to enable widespread use of vanadates as new TCOs.

In summary, the present invention makes it possible to solve a major problem related to certain metal oxides of perovskite type, in particular the TCOs of vanadates. Indeed, as the crystallization of TCOs of vanadates on unsuitable substrates such as glass is a major obstacle, the use of an intermediate seed layer is a key solution that makes it possible to consider technological applications seriously.

Example 2: Thin Films of $CaVO_3$ and $SrTiO_3$

The thin films of $CaVO_3$ and $SrTiO_3$ are deposited on Corning Eagle XG glass (Codex international) substrates of dimension $5 \times 5$ $mm^2$ and 0.5 mm thick. The substrates are cleaned according to the standard protocol described in example 1 (ultrasonic bath of acetone then ethanol).

Deposition of the $TiO_2$ Buffer Layer

After the substrates were cleaned, they were introduced into the deposition chamber by pulsed laser deposition (PLD). Once a vacuum of the order of $10^{-7}$ mbar was reached, the substrates were heated to a temperature of 600° C. A 10 nm-thick $TiO_2$ buffer layer was deposited in an partial pressure of oxygen of $10^{-2}$ mbar using an KrF excimer laser ($\lambda$=248 nm). The laser energy is set at 200 mJ, which corresponds to a fluence of about 2 $J \cdot cm^{\pm 2}$, the frequency of the laser pulses was set at 5 Hz and the target-substrate distance was set at 5 cm.

Deposition of Thin Layers of $CaVO_3$ and $SrTiO_3$

After the $TiO_2$ buffer layer was deposited, the layers of $CaVO_3$ and $SrTiO_3$ were deposited under the same SVO deposition conditions described in example 1, except the frequency of the laser pulses was set at 5 Hz in the case of CVO.

Characterizations

The structural analysis and calculation of the thickness of the films were determined by X-ray diffraction and reflectometry (XRD and XRR) using a Bruker D8 Discover diffractometer operating with a Cu $K_{\alpha 1}$ monochromatic beam ($\lambda$=1.5406 Å). The resistivity of the films at 300 K was determined using the four-point method by means of a Keithley 2450 sourcemeter. The optical transmission of the samples is measured in the UV-visible-near infrared range following the same protocol as that described in example 1.

FIG. 6 shows the X-ray diagrams in grazing incidence configuration of the films of $CaVO_3$ and $SrTiO_3$ deposited on a $TiO_2$ buffer layer. The thicknesses of the $TiO_2$ buffer layer and films of $CaVO_3$ and $SrTiO_3$ were set to about 10 nm and 30 nm, respectively. The thickness of the buffer layer was optimized so that it was sufficient to induce polycrystalline growth of the SVO films.

The diagrams clearly show polycrystalline growth of both CVO and STO films, with no other parasitic phase. The polycrystalline nature of the films is manifested by the appearance of all the characteristic reflections of CVO and STO, also having the right intensity ratio between the peaks. For CVO films, the characteristic diffraction peaks appear at $2\theta$=33.699°, 48.327°, 54.331°, 60.050° and 70.549°, which are associated with the planes (020), (004), (130), (132) and (040) of the $CaVO_3$ orthorhombic perovskite phase (Pnma space group). For STO films, the diffraction peaks appear at $2\theta$=32.450°, 40.031°, 46.528°, 57.881°, 67.861°, and 77.160° associated with the planes (110), (111), (200), (211), (220) and (310) of the $SrTiO_3$ cubic perovskite phase (Pm-3 m space group). The CVO film has a lattice parameter $a_{pc}$=0.375(7) nm close to that of the bulk material $a_{pc}$=0.377 (0) nm (Ref. 1), and the STO film has a lattice parameter a=0.389(8) nm that is similar to that of bulk STO a=0.390(1) nm (Ref. 36).

The polycrystalline growth of the CVO and STO films was fostered by the presence of the $TiO_2$ buffer which crystallizes easily on amorphous substrates and becomes a site of germination and of growth of the CVO and STO films. The present results confirm the potential of using $TiO_2$ as buffer layer for the growth of conductive and transparent metal oxides of perovskite structure on substrates that are not suitable or non-crystalline. Since STO is also widely used as a substrate for the crystal growth of perovskite oxides, the demonstration of crystal growth on the buffer layer then makes it possible to predict the successful growth of such a wide range on the buffer layer coated with an STO layer.

Electrical Properties of $CaVO_3$ and $SrTiO_3$ Films

The resistivity of CVO polycrystalline films at 300 K is comprised between 798 $\mu\Omega \cdot cm$ and 1410 $\mu\Omega \cdot cm$, which remain very good values in comparison with single-crystal CVO, showing a resistivity of 384 $\mu\Omega \cdot cm$ (Ref. 1) and also in comparison to other polycrystalline TCOs cited in reference to FIG. 9. The origin of the increase in resistivity in polycrystalline films is due to the presence of grain boundaries as has already been explained in example 1 in the case of SVO films. The resistivity of STO films is $\rho$=85.3 $m\Omega \cdot cm$, which remains fairly wide for a TCO. However, the electrical properties of the STO are heavily dependent on the oxygen stoichiometry (Ref. 37), thus it is possible that an oxygen atom exchange between the STO film and the buffer layer took place, which explains this resistivity value. It may be necessary to use one of the other materials listed below in example 4 as a buffer layer to avoid this oxygen exchange and thus to obtain lower resistivity values.

Optical Properties of CaVO$_3$ and SrTiO$_3$ Films

FIG. 7 shows the optical transmission spectra of the films of CaVO$_3$/TiO$_2$/glass, SrTiO$_3$/TiO$_2$/glass and a substrate coated with a layer of TiO$_2$ used as reference. The spectra were measured by UV-Visible-NIR spectrophotometry between 350 and 850 nm. The reference sample spectrum shows an optical transmission close to 90% throughout the visible spectrum range, and therefore the influence on the optical transmission of the CaVO$_3$ and SrTiO$_3$ films deposited on top is negligible. The film of CaVO$_3$/TiO$_2$/glass has an optical transmission of 72% at λ=520 nm, which is similar to the transmission of the SVO films shown in example 1 with the same thickness. This optical transmission value is greatly sufficient to use polycrystalline CVO as a TCO. The SrTiO$_3$ films have an optical transmission of 63% at λ=520 nm, which remains an acceptable value for a TCO. Given that the electrical and optical behavior of the STO are correlated and that its electrical behavior depends directly on the oxygen stoichiometry in the film, it is therefore possible to increase the transmittance of the STO films by better controlling its stoichiometry.

Example 3: BaTiO$_3$ Thin Films

BaTiO$_3$ is an oxide of perovskite structure extensively studied for its ferroelectric properties. It is particularly appealing for microelectronic applications as non-volatile ferroelectric memories. The direct growth of thin layers of BaTiO$_3$ on amorphous substrates such as glass has never been reported in the literature. In this example, we demonstrate that by using the strategy of the buffer layer of binary metal oxide, it is possible to deposit polycrystalline BaTiO$_3$ layers on amorphous substrates: The thin films of BaTiO$_3$ (BTO) were deposited on Corning Eagle XG glass substrates (Codex international) of dimension 5×5 mm$^2$ and 0.5 mm thick. The substrates were cleaned according to the protocol described in the context of example 1. A TiO$_2$ buffer layer was deposited before the BTO films were deposited according to the protocol described in the context of example 2.

After the deposition of the TiO$_2$ buffer layer, the BTO films were deposited at a temperature of 645° C. and partial pressure of $5.1 \times 10^{-4}$ mbar of a gas mixture of 0.1% ozone (O$_3$) and 99.9% O$_2$. The films were cooled in a partial pressure of $5 \times 10^{-3}$ mbar.

Results—Example 4: FIG. 8 shows the X-ray diffraction diagram of thin films of BaTiO$_3$. The thickness of the films was determined by X-ray reflectometry to be about 30 nm. The appearance of the different characteristic peaks of the tetragonal BaTiO$_3$ perovskite phase (P4 mm space group) in the diffraction diagram indicates the polycrystalline nature of the layers. The film has an lattice parameter $a_{pc}$=0.399(9) nm, which is equal to that of the bulk material of 0.399(4) nm.

Example 4: Use of Different Binary Metal Oxide Buffer Layers for the Growth of Perovskite Oxide Films In this example, we show the potential of using other binary oxides as used in the above examples as a buffer layer, and which also enable the polycrystalline growth of perovskite structure oxides.

The advantage of having a wide range of binary oxide materials that can be used as a buffer layer is to be able to choose the buffer layer most suited to the growth of each material in terms of lattice parameter mismatch or chemical compatibility. This makes it possible to optimize the functional properties of perovskite oxides.

The thin films of SrVO$_3$ were deposited on Corning Eagle XG glass substrates (Codex international) of dimension 5×5 mm$^2$ and 0.5 mm thick. The substrates were cleaned according to the protocol described in the preceding examples. Buffer layers of YSZ (10% Y$_2$O$_3$, 90% ZrO$_2$), HfO$_2$ and Cr$_2$O$_3$ were deposited by pulsed laser deposition (PLD) under the same TiO$_2$ growth conditions as those described in example 2.

The thicknesses of the buffer layer (YSZ, HfO$_2$ or Cr$_2$O$_3$) and SrVO$_3$ were set at about 10 nm and 30 nm respectively in order to avoid any effect related to the thickness of the buffer layer on the structural, electrical and optical properties of the SrVO$_3$ layers and make it possible to compare only the properties of the SVO films linked to the nature of the buffer layer used.

Structural Properties of SrVO$_3$ Films

FIG. 9 shows the X-ray diffraction diagrams in grazing incidence configuration of the SrVO$_3$ films deposited on the different buffer layers; YSZ, HfO$_2$ and Cr$_2$O$_3$. The three diagrams show a polycrystalline nature of the SVO layers regardless of the buffer layer used, by the appearance of all the diffraction peaks associated with the planes (110), (111), (200), (211), (220) and (310) of the SrVO$_3$ cubic perovskite phase. The diagrams also show the growth of the pure SVO perovskite phase and no secondary phase is detectable, indicating that the three materials used as the buffer layer are chemically stable. Thus, no interfacial reaction or atomic diffusion phenomenon took place between the SVO film and the buffer layers. From the X-ray diagrams, we can see that the three buffer layers make it possible to obtain SrVO$_3$ films of good crystalline quality.

Regarding the lattice parameters of SVO films, it appears that the lattice parameter varies very slightly based on the buffer layer used; the SVO films deposited on a YSZ buffer layer have a lattice parameter $a_{pc}$=0.384(1) nm, on HfO$_2$ $a_{pc}$=0.383(5) nm and on Cr$_2$O$_3$ $a_{pc}$=0.383(1) nm. This slight variation in the lattice parameter could be explained by the presence of oxygen vacancies in the SVO films with a different concentration and which depends on the nature of the metal constituting the buffer layer and its affinity to oxygen.

Electrical Properties of SrVO$_3$ Films

FIG. 10 shows a comparison of the resistivity measurements at 300 K of the SVO films deposited on the different buffer layers (TiO$_2$, YSZ, HfO$_2$ and Cr$_2$O$_3$) with the data from the literature on transparent conductive oxides used as TCO. The thickness of the SVO films was set at approximately 30 nm on all the buffer layers, and it is comparable to the thickness of the other TCOs mentioned in this comparison (poly-ITO, SnO$_2$: F, doped ZnO and doped TiO$_2$) (Ref. 9-15).

The resistivity of the polycrystalline films of SVO is comprised between 294 μΩ·cm and 526 μΩ·cm and seems to depend on the nature of the buffer layer used. These values are very close to the values of the single-crystal SVO films which are of the order of 150 μΩ·cm (Ref. 3). It should be noted that regardless of material used as a buffer layer, the value of the resistivity of the SVO films is comparable to that of ITO. The films deposited on a $Cr_2O_3$ buffer layer have the lowest resistivity of 294 µΩ·cm. This low resistivity is probably due to the presence of the Cr which plays the role of an oxygen absorber in the SVO layer and makes it possible to avoid the formation of another overoxidized phase, which could reduce the performance of the SVO.

The growth of the polycrystalline SVO films on the different buffer layers of YSZ, $HfO_2$ and $Cr_2O_3$ binary oxide which have excellent structural and electrical properties, confirms the results already obtained on $TiO_2$ and opens new avenues to integrating perovskite oxides in industrial devices that have, until now, been a challenge.

Optical Properties of $SrVO_3$ Films

FIG. 11 shows the optical transmission spectra of the SVO films deposited on the three buffer layers of $SrVO_3$/YSZ/Glass, $SrVO_3$/$HfO_2$/Glass and $SrVO_3$/$Cr_2O_3$/Glass and a bare glass substrate used as a reference. The spectra were measured by UV-Visible-NIR spectrophotometry between 350 and 850 nm. The reference sample spectrum shows an optical transmission greater than 90% throughout the visible spectrum range, and therefore its influence on the transmission of the SVO films deposited on top is considered to be negligible. The SVO films deposited on the three YSZ, $HfO_2$ and $Cr_2O_3$ buffer layers show an optical transmission of 58%. This transmission difference relative to the samples shown in example 1 can be explained by a contribution of the buffer layers.

Comments and analyses: In examples 1 to 4, it is shown that it is possible to deposit polycrystalline layers of $SrVO_3$ which have good structural, electrical and optical properties on amorphous glass substrates using the invention of the binary oxide buffer layer such as $TiO_2$, YSZ, $HfO_2$ and $Cr_2O_3$. It has been noted that there is a degradation of the functional properties of the SVO films with time: formation of an overoxidized phase of $Sr_3V_2O_8$ and increased resistivity of the films (Ref. 38-40). Before SVO films are integrated in industrial devices such as solar cells or flat screens, it is essential to ensure the durability of the SVO properties.

Example 5: Protective Layers

In this example, we show the effectiveness of using a metal oxide-based protective layer which will protect the SVO films against degradation.

Accelerated aging measurements were carried out on five SVO samples using a hot plate; the heating temperature was set at 250° C. The change in the resistivity of the films was monitored in-situ using a four-point measuring head connected to a Keithley 2450 Sourcemeter to record the variation in resistivity as a function of time. The SVO film was deposited on glass with a $TiO_2$ buffer layer as described in example 1. The materials used as a protective layer are $Al_2O_3$, $LaAlO_3$ (LAO) and $TiO_2$. They were deposited in a subsequent manner on the SVO film, using the same deposition technique. $TiO_2$ was deposited under two different conditions: under vacuum and with a partial pressure of oxygen of $10^{-2}$ mbar which, in the remainder of this example, will be referred to as $TiO_2$-vacuum and $TiO_2$—O respectively. The other materials were deposited under vacuum; the deposition temperature was set at 100° C. for all films in order to obtain amorphous films. The thickness of the protective layer was set at about 7 nm.

Results

Accelerated Aging Measurements

FIG. 12-a represents the accelerated aging measurements carried out at a temperature of 250° C. and for 24 hours on thin films of SVO without a protective layer and with a protective layer of $TiO_2$ (deposited under vacuum and with a partial pressure of oxygen), LAO and $Al_2O_3$. The sharp increase in resistivity of the SVO layer without a protective layer as a function of time shows its rapid aging, resulting in an insulating behavior at the end of the test. FIG. 12-a shows that the resistivity of the SVO films with a protective layer varies much more slowly. In FIG. 12-b, we have plotted the change in the resistivity without showing the curve of the SVO film without a protective layer in order to highlight the differences in behavior between the various protective layers. The four protective layers appear to be effective and clearly protect the conductive phase of the SVO. The LAO and $Al_2O_3$ films have a very low variation in resistivity, and thus the best protection properties. In the case of $Al_2O_3$, the ratio between the final resistivity after 24 hours of aging and the initial resistivity is 1.48, for the LAO layer, this ratio is 1.54, for $TiO_2$—O it is 20, for $TiO_2$-vacuum, this ratio is 35. For the SVO film without a protective layer, it is $1.08 \times 10^4$. The protective power of each material is directly linked to its oxygen affinity, which seems to be the main cause of the degradation of SVO films; the protection could also be acquired if the protective layer plays the role of a barrier between the SVO film and the oxygen present in the air.

Structural Properties of $SrVO_3$ Films

FIG. 13 shows the X-ray diffraction diagrams of the SVO films without a protective layer and with a protective layer of $TiO_2$—O, $TiO_2$-vacuum, $Al_2O_3$ and LAO. The five films were subjected to accelerated aging at a temperature of 250° C. for 24 hours. The diffraction diagram of the SVO film without a protective layer shows no diffraction peak, which indicates that the film has become amorphous or contains crystalline domains that are too small to be detected by X-ray diffraction. Regarding the SVO films with a protective layer, the diffraction peaks are always present regardless of the protective layer, which shows that the protected SVO films retain their polycrystalline structure. They are not degraded during the aging test. This result is in good agreement with the electrical measurements that show that the protected SVO layer retains its metallic behavior.

REFERENCES

1. L. Zhang, Y. Zhou, L. Guo, W. Zhao, A. Barnes, H.-T. Zhang, C. Eaton, Y. Zheng, M. Brahlek, H. F. Haneef, N. J. Podraza, M. H. W. Chan, V. Gopalan, K. M. Rabe, R. Engel-Herbert, Nat. Mater. 15, 204 (2016).
2. K.-J. Range, F. Rau, U. Klement, Z. Für Naturforschung B 46, 1315 (1991).
3. A. Boileau, A. Cheikh, A. Fouchet, A. David, C. Labbé, P. Marie, F. Gourbilleau, U. Lüders, Adv. Optical Mater. 1801516 (2019).
4. A. Boileau, A. Cheikh, A. Fouchet, A. David, R. Escobar-Galindo, C. Labbé, P. Marie, F. Gourbilleau, U. Lüders, Appl. Phys. Lett. 112, 021905 (2018).
5. I. H. Inoue, O. Goto, H. Makino, N. E. Hussey, M. Ishikawa, Phys. Rev. B 58, 4372 (1998).

6. J. Macias, A. A. Yaremchenko, J. R. Frade, Journal of Alloys and Compounds 601, 186-194 (2014).
7. D. H. Kim, D.-W. Kim, B. S. Kang, T. W. Noh, D. R. Lee, K.-B. Lee, S. J. Lee, Solid State Communications 114, 473-476 (2000).
8. A. Fouchet, M. Allain, B. Bérini, E. Popova, P.-E. Janolin, N. Guiblin, E. Chikoidze, J. Scola, D. Hrabovsky, Y. Dumont, N. Keller, Mater. Sci. Eng. B 212, 7 (2016).
9. U. Betz, M. Kharrazi Olsson, J. Marthy, M. F. Escola' and F. Atamny, Surf. Coat. Technol. 200, 5751-5759 (2006).
10. D. S. Bhachu, M. R. Waugh, K. Zeissler, W. R. Branford and I. P. Parkin, Chem. Eur. J. 17, 11613-11621 (2011).
11. R. Mientus and K. Ellmer, Surf. Coat. Technol. 98, 1267-1271 (1998).
12. V. Assunção, E. Fortunato, A. Marques, A. Gonçalves, I. Ferreira, H. Águas and R. Martins, Thin Solid Films 442, 102-106 (2003).
13. L.-H. Wong and Y.-S. Lai, Thin Solid Films 583, 205-211 (2015).
14. T. Hitosugi, A. Ueda, S. Nakao, N. Yamada, Y. Furubayashi, Y. Hirose, T. Shimada and T. Hasegawa, Appl. Phys. Lett. 90, 212106 (2007).
15. B.-B. Wu, F.-M. Pan and Y.-E. Yang, Chin. Phys. Lett. 28, 118102 (2011).
16. A. J. Freeman, K. R. Poeppelmeier, T. O. Mason, R. P. H. Chang, and T. J. Marks, MRS Bull. 25, 45 (2000).
17. S. C. Dixon, D. O. Scanlon, C. J. Carmalt, and I. P. Parkin, J. Mater. Chem. C 4, 6946 (2016).
18. G. Haacke, J. Appl. Phys. 47, 4086-4089 (1976).
19. B. Bérini, V. Demange, M. Bouttemy, E. Popova, N. Keller, Y. Dumont, A. Fouchet, Adv. Mater. Interfaces 3, 1600274 (2016).
20. D. L. Ritums, N. J. Wu, X. Chen, D. Liu, A. Ignatiev, AIP Conf. Proc. 420, 672 (1998).
21. P. W. Yip, K. H. Wong, MRS Online Proc. Libr. Arch. 623 (2000).
22. H. Ohta, M. Orita, M. Hirano and H. Hosono, J. Appl. Phys. 91, 3547-3550 (2002).
23. J. A. Moyer, C. Eaton, R. Engel-Herbert, Adv. Mater. 25, 3578 (2013).
24. K. Ellmer, Nature Photon. 6, 809-817 (2012).
25. F. L. Wong, M. K. Fung, S. W. Tong, C. S. Lee and S. T. Lee, Thin Solid Films, 466, 225-230 (2004).
26. V. Teixeira, H. N. Cui, L. J. Meng, E. Fortunato, R. Martins, Thin Solid Films 420-421, 70-75 (2002).
27. B. O'Connor, C. Haughn, K.-H. An, K. P. Pipe, and M. Shtein, Appl. Phys. Lett. 93, 223304 (2008).
28. D. R. Sahu, S.-Y. Lin, J.-L. Huang, Applied Surface Science 252, 7509-7514 (2006).
29. J. B. Goodenough, Reports on Progress in Physics 67, 1915-1993 (2004).
30. L. Hu, R. Wei, J. Yan, D. Wang, X. Tang, X. Luo, W Song, J. Dai, X. Zhu, C. Zhang, Y. Sun, Advanced Electronic Materials 4, 1700476 (2018).
31. K. H. L. Zhang, Y. Du, A. Papadogianni, O. Bierwagen, S. Sallis, L. F. J. Piper, M. E. Bowden, V. Shutthanandan, P. V. Sushko, S. A. Chambers, Advanced Materials 27, 5191-5195 (2015).
32. O. Y. Gorbenko, S. V. Samoilenkov, I. E. Graboy, A. R. Kaul, Chem. Mater. 14, 4026-4043 (2002).
33. D. G. Schlom, L.-Q. Chen, X. Pan, A. Schmehl, M. A. Zurbuchen, Journal of the American Ceramic Society 91, 2429-2454 (2008).
34. J. M. D. Coey, M. Viret, S. von Molnar, Advances in Physics 48, 167-293 (1999).
35. K. M. Rabe, M. Dawber, C. Lichtensteiger, C. H. Ahn, J.-M. Triscone, Topics Appl. Physics 105, 1-30 (2007).
36. Yu. A. Abramov, V. G. Tsirelson, V. E. Zavodnik, S. A. Ivanov, and I. D. Brown, Acta Crystallogr B Struct Sci 51, 942 (1995).
37. J. Ravichandran, W. Siemons, H. Heijmerikx, M. Huijben, A. Majumdar, and R. Ramesh, Chemistry of Materials 22, 3983 (2010).
38. He, H., Yang, Z., Xu, Y. et al. Nano Convergence 7, 32 (2020).
39. A. Sharma, M. Varshney, W. Cheol Lim, H.-J. Shin, J. Pal Singh, S. Ok Won, and K. Hwa Chae, Phys. Chem. Chem. Phys. 19, 6397 (2017).
40. R. C. Germanicus, Y. Bourlier, V. Notot, B. Bérini, V. Demange, M. Berthe, A. Boileau, M. Euchin, Y. Dumont, D. Aureau, M. Fregnaux, B. Grandidier, U. Lüders, A. David, W. Prellier, L. Biadala, and A. Fouchet, Applied Surface Science 510, 145522 (2020).

The invention claimed is:

1. A multilayer conductive system of metal oxides comprising:
   i. an amorphous substrate;
   ii. a layer of a crystalline binary metal oxide deposited on the substrate (i); and
   iii. a layer of a crystalline conductive metal oxide having a crystalline structure of perovskite type superposed over the layer of binary metal oxide (ii);
   the binary metal oxide of the layer (ii) having a local lattice mismatch of less than 5% with respect to that of the metal oxide of the layer (iii);
   provided that when the metal oxide of perovskite type of the layer (iii) is a crystalline transparent conductive metal oxide, the substrate (i) is transparent and the thickness of the crystalline binary metal oxide layer (ii) is <20 nm.

2. The multilayer conductive system according to claim 1, wherein the metal oxide of perovskite type of the layer (iii) comprises:
   A. a crystalline transparent conductive metal oxide having a formula $ABO_3$ wherein A is selected from Sr or Ca optionally doped with La or another element from the group of lanthanides, and B is selected from V, Cr, Ti or Mo;
   B. a manganite with colossal magnetoresistance of perovskite structure with the formula $Ln_{(1-x)}A_xMnO_3$ wherein Ln represents a rare earth atom, A is selected from alkaline earth atoms and x represents a doping level of the alkaline earths, or C. a ferroelectric metal oxide of perovskite structure with the formula $ABO_3$, wherein A is selected from Ba, Pb or K, and B is selected from Ti, Zr or Ta.

3. The multilayer conductive system according to claim 1, wherein the metal oxide of perovskite type of the layer (iii) comprises a ferroelectric oxide (C), and:
   (i) the binary metal oxide of the layer (ii) is a conductive binary metal oxide; or
   (ii) the binary metal oxide of the layer (ii) is an insulating binary metal oxide, the substrate (i) is a conductive substrate;
   the multilayer system further comprising a conductive layer (cc) superposed over the layer (iii).

4. The multilayer conductive system according to claim 3, wherein the conductive layer (cc) comprises a conductive material selected from at least one of:
   a conductive metal oxide comprising $TiO_2$ or O-substoichiometric ZnO;
   a conductive perovskite oxide; or
   a conductive metal layer, comprising a layer of gold, silver, or aluminum.

5. The multilayer conductive system according to claim 1, wherein the substrate (i) is transparent, the crystalline binary metal oxide layer (ii) has a thickness <20 nm, and the crystalline conductive metal oxide of perovskite type of the layer (iii) is transparent, and wherein
the system further comprises a transparent layer (ct) superposed over the layer (iii) of conductive metal oxide, said transparent layer (ct) being a layer of a conductive metal oxide or an insulating oxide, the layer (ct) covering all or part of the layer (iii).

6. The multilayer conductive system according to claim 1, wherein the crystalline binary metal oxide of the layer (ii) is selected from at least one of the following oxides: $SnO_2$, $ZnO$, $Y_2O_3$, $ZrO_2$, $HfO_2$, $Cr_2O_3$, and $TiO_2$.

7. The multilayer conductive system according to claim 5, wherein the layer (iii) of transparent conductive metal oxide has a thickness of 20 to 100 nm.

8. The multilayer conductive system according to claim 5, wherein the transparent crystalline conductive metal oxide of perovskite type of the layer (iii) has a formula $ABO_3$ and is doped on the A-site with Ca, La, or other lanthanides; and/or on the B-site with Ti, Cr, Mo, or other transition metals.

9. The multilayer conductive system according to claim 5, wherein the transparent crystalline conductive metal oxide of perovskite type of the layer (iii) has a formula $ABO_3$ and is selected from $SrVO_3$, $SrCrO_3$ and $SrMoO_3$ optionally doped with Ca, La, or other lanthanides on the "Sr" site; or $CaVO_3$ optionally doped on the "Ca" site with Sr, La, or other lanthanides.

10. The multilayer conductive system according to claim 5, wherein the transparent substrate (i) is an amorphous transparent material having a temperature resistance of 500° C.

11. The multilayer conductive system according to claim 5, which has an optical transparency in the visible region >70%.

12. An electronic component comprising a multilayer conductive system of metal oxides according to claim 1.

13. A method for preparing the multilayer conductive system of metal oxides according to claim 1, comprising:
(a) depositing on an amorphous substrate, optionally transparent, a layer of a crystalline binary metal oxide;
(b) the crystal growth of a layer of a crystalline conductive metal oxide on the crystalline binary oxide layer obtained in step a), wherein the conductive metal oxide has a crystalline structure of perovskite type; and
(c) optionally coating the conductive metal oxide layer obtained in b) with a protective layer (cp), optionally transparent, of a conductive metal oxide or an insulating oxide,
the layer obtained in c) covering all or part of the conductive metal oxide layer obtained in b);
the binary metal oxide of step a) having a local lattice mismatch of less than 5% with respect to that of the crystalline conductive metal oxide of perovskite type of step b);
provided that when the metal oxide of perovskite type of the layer of step b) is a crystalline transparent conductive metal oxide, the substrate of step a) is transparent and the thickness of the crystalline binary metal oxide layer of step a) is <20 nm.

14. The method according to claim 13, wherein step a) is carried out by a thin layer deposition technique comprising at least one of vacuum cathode sputtering, molecular beam epitaxy or chemical vapor deposition techniques comprising metalorganic chemical vapor deposition or atomic layer deposition.

15. The method according to claim 13, wherein step b) is carried out at a temperature ≥400° C., by pulsed laser deposition, by vacuum cathode sputtering, by molecular beam epitaxy or by chemical vapor deposition techniques comprising at least one of metalorganic chemical vapor deposition or atomic layer deposition, or by pulsed laser ablation.

16. The multilayer conductive system of metal oxides according to claim 1, configured for use:
in optoelectronics;
in solar technologies comprising solar cells or panels;
in sensor technology, comprising touch sensors;
in display technologies comprising liquid crystal screens, flat screens, plasma screens, and touch screens;
in infrared reflective coatings comprising infrared filters/mirrors or glazing/glazing units with low emissivity;
in electromagnetic shielding,
in transparent electronics;
in integrated antennas; and/or
in conductive substrates for integrated circuits.

17. The multilayer conductive system according to claim 1, wherein the metal oxide of perovskite type of the layer (iii) comprises a ferroelectric oxide (C), and the binary metal oxide of the layer (ii) is an insulating binary metal oxide, the substrate (i) is an optionally transparent insulating substrate, and the system further comprises an additional conductive layer (iv) located between the substrate (i) and the layer (ii) of binary metal oxide;
the multilayer system further comprising a conductive layer (cc) superposed over the layer 111).

18. The multilayer conductive system according to claim 17, wherein the conductive layer (cc) comprises a conductive material selected from at least one of:
a conductive metal oxide comprising $TiO_2$ or O-substoichiometric ZnO;
a conductive perovskite oxide; or
a conductive metal layer, comprising a layer of gold, silver, or aluminum.

\* \* \* \* \*